(12) United States Patent
Nagahara et al.

(10) Patent No.: US 7,396,633 B2
(45) Date of Patent: Jul. 8, 2008

(54) CHEMICALLY AMPLIFIED RESIST COMPOSITION AND MANUFACTURING METHOD OF SEMICONDUCTOR INTEGRATED CIRCUIT DEVICE WITH SUCH CHEMICALLY AMPLIFIED RESIST COMPOSITION

(75) Inventors: Seiji Nagahara, Kanagawa (JP); Satoshi Watanabe, Tokyo (JP); Kazunori Maeda, Tokyo (JP)

(73) Assignees: NEC Electronics Corporation, Kanagawa (JP); Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/873,475

(22) Filed: Jun. 23, 2004

(65) Prior Publication Data
US 2004/0259029 A1    Dec. 23, 2004

(30) Foreign Application Priority Data
Jun. 23, 2003    (JP)    ............................. 2003-178794

(51) Int. Cl.
*G03C 1/73* (2006.01)
*G03F 7/039* (2006.01)
*G03F 7/038* (2006.01)

(52) U.S. Cl. .................. 430/270.1; 430/914; 430/921; 430/919; 430/325; 430/326

(58) Field of Classification Search ...................... None
See application file for complete search history.

(56) References Cited

U.S. PATENT DOCUMENTS

| 5,650,261 A | * | 7/1997 | Winkle ................ 430/270.1 |
| 2005/0032373 A1 | * | 2/2005 | Cameron et al. ........... 438/689 |
| 2005/0100814 A1 | * | 5/2005 | Berger et al. ............ 430/270.1 |

FOREIGN PATENT DOCUMENTS

| JP | 2001-100400 | 4/2001 |
| WO | WO01/04706 | 1/2001 |

* cited by examiner

*Primary Examiner*—Sin J. Lee
(74) *Attorney, Agent, or Firm*—Young & Thompson

(57) ABSTRACT

With the damascene process in which an interconnection is formed using a conventional chemically amplified positive photoresist composition, there arises a problem that the photoresist within the via hole (as well as in its vicinity) may remain even after the exposure and the development are carried out. The present invention relates to a chemically amplified resist composition comprising, at least, a photo acid generator, a quencher and a salt having a buffering function for an acid which is generated from the acid generator by irradiation, wherein the salt having the buffering function for the acid generated from the acid generator is a salt derived from a long chain alkylbenzenesulfonic acid or a long chain alkoxybenzenesulfonic acid and an organic amine that is a basic compound.

23 Claims, 4 Drawing Sheets

Capillary Electrophoresis Method

Component Identification for The Organic Peeling Agent

Identification for the Component which attached onto the substrate

Salt A (⑤) :

4-n-dodecylphenylsulfonic acid tris(2-hydroxyethyl)amine

Salt 1 (④) :

4-n-butylphenylsulfonic acid tris(2-hydroxyethyl)amine

Salt 2 (③) :

4-n-propylphenylsulfonic acid tris(2-hydroxyethyl)amine

Salt 3 (②) :

4-n-ethylphenylsulfonic acid tris(2-hydroxyethyl)amine

Salt 4 (①) :

4-n-methylphenylsulfonic acid tris(2-hydroxyethyl)amine

CHEMICALLY AMPLIFIED RESIST COMPOSITION AND MANUFACTURING METHOD OF SEMICONDUCTOR INTEGRATED CIRCUIT DEVICE WITH SUCH CHEMICALLY AMPLIFIED RESIST COMPOSITION

BACKGROUND OF THE INVENTION

1. Field of the Invention

The present invention relates to a chemically amplified resist composition and a manufacturing method of a semiconductor integrated circuit device wherein such a chemically amplified resist composition is utilized.

2. Description of the Related Art

The recent advance in the degree of integration in the semiconductor integrated circuit has put the ULSI (Ultra Large-Scaled Integrated circuit) into practical use. The technology to produce the ULSI has been attained through the progress in the miniaturization of conductive interconnections, electrodes and the like, and the minimum pattern currently in practical use is in the submicron range of 0.14 μm, while the minimum pattern aimed to attain at the moment is of 0.08 μm. Accompanying the miniaturization, the change in the light beam used for the exposure in the resist pattern formation has been taking place, from the ultraviolet rays conventionally utilized to the radioactive rays such as far-ultraviolet rays, electron rays and X-rays, with its wavelength shifting to a shorter region.

The chemically amplified resist is a very resist material that can stand the use under these shorter wavelengths and is used as such.

With the chemically amplified photoresist, its irradiated section is made soluble in an alkaline developer solution through a chemical reaction that is catalyzed by an acid generated from an acid generator by irradiation. Some chemically amplified photoresists provide positive patterns and the others, negative patterns.

In the case of the chemically amplified positive resist, the resist wherein a photo acid generator (PAG) is mixed into polymers is used, and the exposure (irradiation) of the chemically amplified positive resist sets off chain-reacting elimination reactions or hydrolytic reactions in the polymers, with a Brnsted acid generated from the photo acid generator by exposure acting as a catalyst, forming hydrophilic groups in the polymers and rendering the exposed section soluble in the alkaline developer solution, and thereby a positive resist pattern is formed.

In the case of the chemically amplified negative resist, the resist wherein a cross-linking agent and a photo acid generator are added and mixed into polymers which are soluble in the developer solution is used. With a Brnsted acid generated from the photo acid generator by exposure acting as a catalyst, the exposure sets off chain-reacting cross-linking reactions in the polymers, making them to have larger molecular weights, and, at the same time, the polar groups thereof nonpolar by cross-linking so that the exposed sections are made insoluble in the developer solution, and thereby a negative resist pattern is formed.

In the case of the chemically amplified positive resist, however, the photo acid generator itself may be dissociated by exposure and the acid concentration in the vicinity of the resist surface is increased, giving rise to a problem that the pattern takes the form of a taper.

Meanwhile, in the case of the chemically amplified negative resist, the photo acid generator itself may be dissociated by exposure and the acid concentration in the vicinity of the resist surface is increased, giving rise to a problem that the top section of the pattern becomes overhanging in shape.

To overcome such problems, it has been known that the basic compound can be added into the chemically amplified resist with the object of controlling acid diffusion. Since the added basic compound is considered to quench the acid which is generated from the photo acid generator by irradiation, it is generally called a quencher. The addition of the quencher suppresses the formation of the surface layer of low solubility and leads to improvements in various aspects such as the sensitivity, the resolution, the pattern shape and the process stability.

Along with the progress in the miniaturization, a variety of compounds are even now being developed as a quencher and Japanese Patent Application Laid-open No. 100400/2001 and WO No. 004706/2001 disclose some of them.

In Japanese Patent Application Laid-open No. 100400/2001, there is selected a compound with an annular frame containing at least one nitrogen atom, which can be decomposed by an acid generated from a photo acid generator by exposure to form an acid weaker than the original acid. Further, in WO No. 004706/2001, there is given an amine derivative having a specific basicity as a quencher.

Now, referring to the drawings, a method of manufacturing a semiconductor integrated circuit device wherein an ordinal trench interconnection is utilized is described below.

FIG. 2 shows one example of a conventional manufacturing method of a via hole first type dual damascene interconnection.

First, a coating of a first anti-reflection film (not shown in the drawings) is applied onto the entire surface of a substrate wherein a first etching barrier film 7, a first interlayer insulating film 6, a second etching barrier film 5, a second interlayer insulating film. (a low-dielectric-constant film) 4 and a cap film (an insulating film) 3 are formed on a Cu lower layer interconnection layer 8, in this order, from the side of the substrate, and a first photoresist pattern (for via hole formation) is formed on the surface of the first anti-reflection film. Subsequently, using this first photoresist pattern as an etching mask, the first anti-reflection film, the cap film 3, the second interlayer insulating film 4, the second etching barrier film 5 and the first interlayer insulating film 6 are selectively etched in succession till the first etching barrier film 7 is exposed, and thereby a via hole 21 is formed (See FIG. 2(a)).

For the damascene interconnection structure, because Cu is utilized as the interconnection metal, the acid cleaning cannot be employed after etching of the via hole on the grounds that this cleaning, through the via hole which has been just made open, may cause oxidation of the metal used in the interconnection. Yet, ashing alone cannot remove etching residues thoroughly. The organic peeling-off is, therefore carried out after the step of ashing, using an organic peeling agent.

Next, after the first anti-reflection film and the first photoresist pattern are removed with ashing and the use of the organic peeling agent (See FIG. 2(a)), a second anti-reflection film 2 is formed over the entire surface of the substrate (in such a way that the via hole 21 may not be filled up completely) (See FIG. 2(b)) and a coating of a photoresist 1 is applied onto the surface of the anti-reflection film 2 (See FIG. 2(c)). With exposure being applied onto the coating of the photoresist, a second photoresist pattern 1 (for interconnection trench formation) is formed (See FIG. 2(d)) and, then, using this as an etching mask, the second anti-reflection film 2, the cap film 3 and the second interlayer insulating film 4 are selectively etched in succession till the second etching barrier film 5 is exposed (See FIGS. 2(e) and (f)), and thereby an interconnection trench 22 is formed.

Next, after the second anti-reflection film 2 and the second photoresist pattern 1 are peeled off or removed with ashing and the use of the organic peeling agent, the exposed first etching barrier film 7 is etched by the etch back method till the Cu lower layer interconnection layer 8 is exposed (See FIG. 2(g)). Next, following the cleaning of the substrate where a part of the Cu lower layer interconnection layer 8 is exposed a seed film and a metal barrier film are formed on the substrate, and thereafter a Cu plating film 9 is grown so as to fill up the via hole and the interconnection trench. After that, carrying out the CMP (Chemical Mechanical Polishing), the Cu plating film 9 and the cap film 3 are planarized (till the cap film 3 becomes almost completely removed) (See FIG. 2(h)). A dual damascene interconnection 9 that is electrically connected with the Cu lower layer interconnection layer 8 is thereby formed.

However, when the second photoresist pattern 1 is formed using a conventional chemically amplified positive photoresist composition, there arises a problem that the photoresist within the via hole 21 (as well as in its vicinity) may remain even after the exposure and the development are carried out.

To the positive resist, this phenomenon corresponds to the lowering of the sensitivity of the photoresist in part.

The cause to bring about such a problem is, in the present inventors' view, as follows. When application of coatings of an anti-reflection film and a chemically amplified photoresist composition and the exposure thereto are made without any pretreatment (heat treatment, UV treatment, oxygen plasma treatment or such), contaminants such as basic compounds and the moisture which are attached onto or seeped into the substrate surface (such as the wall surface of the via hole in the interlayer insulating film) may pass through the anti-reflection film and permeate into the photoresist in baking (a pre-bake: for removing the solvent) of the anti-reflection film and the photoresist.

In other words, because a deep opening and a deep trench are formed in the via hole first type dual damascene method, residues formed at the time of dry etching cannot be removed by ordinary cleaning methods. Therefore, an alkaline organic peeling agent including an organic amineis employed to accomplish thorough removal.

The contaminants such as basic compounds (amine components) contained in this organic peeling agent, the moisture and floating basic substances in the air become concentrated by attaching onto or seeping into the wall surface (interlayer insulating film) of the via hole. After that, when coatings of an anti-reflection film and a photoresist (a chemically amplified positive photoresist composition) for the interconnection trench are applied onto the substrate surface including the wall surface of the via hole, and pre-bake is conducted, the contaminants which become concentrated by attaching onto or seeping into the wall surface of the via hole permeate into the photoresist from the wall surface of the via hole, passing through the anti-reflection film. On irradiation, the permeated contaminants (such as amine components) neutralize the catalyst acid (H+) generated by photolysis of the photo acid generator contained in the photoresist (chemically amplified positive photoresist). The neutralization of the catalyst acid with these contaminants deactivates (becomes short of) the acidic catalysts in the photoresist (which is called the poisoning).

The photoresist in the region where the acidic catalysts are deactivated becomes incapable of undergoing a change (polarity change) to convert into a substance soluble in the developer solution. (For instance, a protecting group such as an acetal group becomes deblocked so that a chain reaction to form a hydroxyl group becomes difficult to take place). The photoresist in the region (within the via hole or in its vicinity) where the conversion into a substance soluble to the developer solution does not occur remains without dissolving. This makes the resist pattern within the via hole or in its vicinity have defective resolution.

Further, the experiments conducted by the present inventors showed that, with conventional chemically amplified resists, if the condition allowed the poisoning to occur, the development performed for 30 seconds could provide good resist patterns in the absence of the via hole but the resist pattern formed thereby around the via holes had faulty resolution due to severe poisoning. Although the resistance against poisoning could be raised by extending the development time period to 60 seconds, the resulting resolution remained insufficient.

Further, the experiments by the present inventors revealed such a problem (faulty resolution) became more marked if, in place of conventional silicon oxide films, low-dielectric-constant insulating films (Low-k films; for example, the dielectric constant <3.0) were utilized for the first interlayer insulating film 4 and the second interlayer insulating film 6. That is, when low-dielectric-constant insulating films were used, there arose a problem that the region where the photoresist remained without dissolving in the developer solution (the photoresist remained unresolved even though having subjected to the exposure) expanded.

This sort of the problem is considered by the present inventors to result from a fact that the low-dielectric-constant films (Low-k films) are often porous films whose molecular structure have spatial gaps and moreover, because these gaps (fine holes) tend to increase for the substances with lower dielectric constants, more contaminants become liable to attach onto (adsorb) or seeped into for the low-dielectric-constant films than for the ordinary interlayer insulating films (SiO2). As a result, the amount of contaminants to permeate into the photoresist from the low-dielectric-constant film becomes greater than that from the silicon oxide film and the region where the resist pattern has poor resolution expands.

The remaining photoresist of this sort covers circumference section of the via hole on the surface of the cap film 3, and, when the interconnection trench 22 is formed by etching, the remaining photoresist becomes halo-like on the cap film 3 so that a tapering cylindrical projection 10 made of the cap film 3 or the second interlayer insulating film 4 is formed in peripheral region of the via hole (See FIG. 2(g)). In the case that the low-dielectric-constant films (Low-k films) are employed for the interlayer insulating films, the projection 10 becomes larger. If formation of the Cu dual damascene interconnection 9 is carried out, while such a projection 10 remains, the presence of the projection 10 brings about separation or faulty connection between the via plug section and the interconnection section in the dual damascene interconnection 9 and, thus, results in unsatisfactory electrical connection between the via plug section and the interconnection section in the dual damascene interconnection 9 (See FIG. 2(h)). Accordingly, the reliability of the semiconductor device deteriorates.

SUMMARY OF THE INVENTION

The present invention relates to a chemically amplified resist composition comprising, at least, a photo acid generator, a quencher and a salt having a buffering function for an acid which is generated from said acid generator by irradiation, wherein the salt having the buffering function for the acid generated from the acid generator is specifically a salt derived from a long chain alkylbenzenesulfonic acid or a long chain alkoxybenzenesulfonic acid and an organic amine that is a basic compound, being expressed by the following Formulae (1), (1a) or (1b).

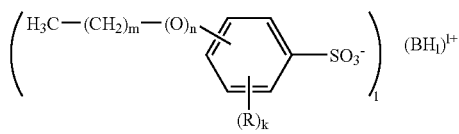
(1)

(In the Formula, R each represent, independently with one another, a hydrogen atom or a straight, branched or cyclic alkyl or alkoxy group containing from 1 to 4 carbons with or without substitution. n is 0 or 1 and m is an integer of 3 to 23. k is an integer of 0 to 4. Examples of B include primary, secondary and tertiary aliphatic amines, mixed amines, aromatic amines, heterocyclic amines, nitrogen-containing compounds with a carboxy group, nitrogen-containing compounds with a sulfonyl group, nitrogen-containing compounds with a hydoxy group, nitrogen-containing compounds with a hydroxyphenyl group, alcoholic nitrogen-containing compounds, nitrogen-containing compounds with a cyano group, amide derivatives and imide derivatives. I is an integer of 1 to 3.)

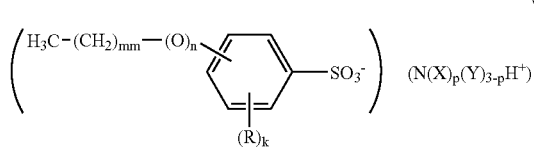
(1a)

(In the Formula, Rs each represent, independently with one another, a hydrogen atom or a straight, branched or cyclic alkyl or alkoxy group containing from 1 to 4 carbons with or without substitution. N is 0 or 1, and k is an integer of 0 to 4. Mm is an integer of 3 to 11 and p is an integer of 1 to 3. Side chains X can be identical or different and each expressed by one of the following Formulae (X)-1 to (X)-3. Side chains Y can be identical or different, each representing a hydrogen atom or a straight, branched or cyclic alkyl group containing from 1 to 20 carbons, which may comprise an ether group or a hydroxyl group. Further, Xs may combine with each other to form a ring. Herein, $R^{300}$, $R^{302}$ and $R^{305}$ are each a straight or branched alkylene group containing from 1 to 4 carbons, $R^{301}$ and $R^{304}$ are each a hydrogen atom or a straight, branched or cyclic alkyl group containing from 1 to 20 carbons, which may comprise one or more hydroxy groups, ether groups, ester groups and/or lactone rings. $R^{303}$ is a straight or branched single-bond alkylene group containing from 1 to 4 carbons, and $R^{306}$ is a straight, branched or cyclic alkyl group containing from 1 to 20 carbons, which may comprise one or more hydroxy groups, ether groups, ester groups and/or lactone rings.)

(X)-1

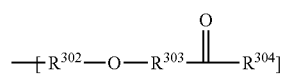
(X)-2

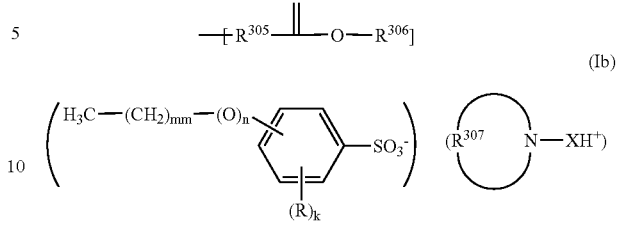

(In the Formula, Rs each represent, independently with one another, a hydrogen atom or a straight, branched or cyclic alkyl or alkoxy group containing from 1 to 4 carbons with or without substitution. n is 0 or 1, and k is an integer of 0 to 4. A side chain X can be expressed by one of the above-mentioned general Formulae (X)-1 to (X)-3. mm is an integer of 3 to 11 and $R^{307}$ is a straight or branched alkylene group containing from 2 to 20 carbons, which may comprise one or more carbonyl groups, ether groups, ester groups and/or sulfides.)

In the present invention, by containing a salt having a buffering function for an acid generated from an acid generator, excellent resist patterns can be formed even on a substrate surface where an organic peeling agent (poisoning substance) is attached or seeped without lowering the exposure sensitivity.

Further, with the buffering effect functioning, the influence that fluctuations in exposure dose has over the acidity becomes smaller and less immediate so that the exposure dose margin for the resist increases.

Further, when, using the chemically amplified resist, the resist pattern is obtained by the photolithography, anomalous bodies tend to appear in the resist and, thus, the resist storage temperature, time period in use, temperature condition for the development and such must be kept under strict control. In contrast with this, in the present invention, the very appearance of the anomalous bodies is lessened. The drop of the anomalous body appearance leads to an decrease in the number of defects caused by anomalous bodies after the exposure and development of the resist are carried out and, therefore, the occurrence of the severance of the interconnection and the faulty connection of the via plug is diminished.

Further, when a basic substrate of TiN, SiN, SiCN, SiON or such is used, the resist pattern with a chemically amplified positive resist tends to show long tails. Against this, too, the resist in the present invention has an effect of reducing this tailing phenomenon.

Figure 1:
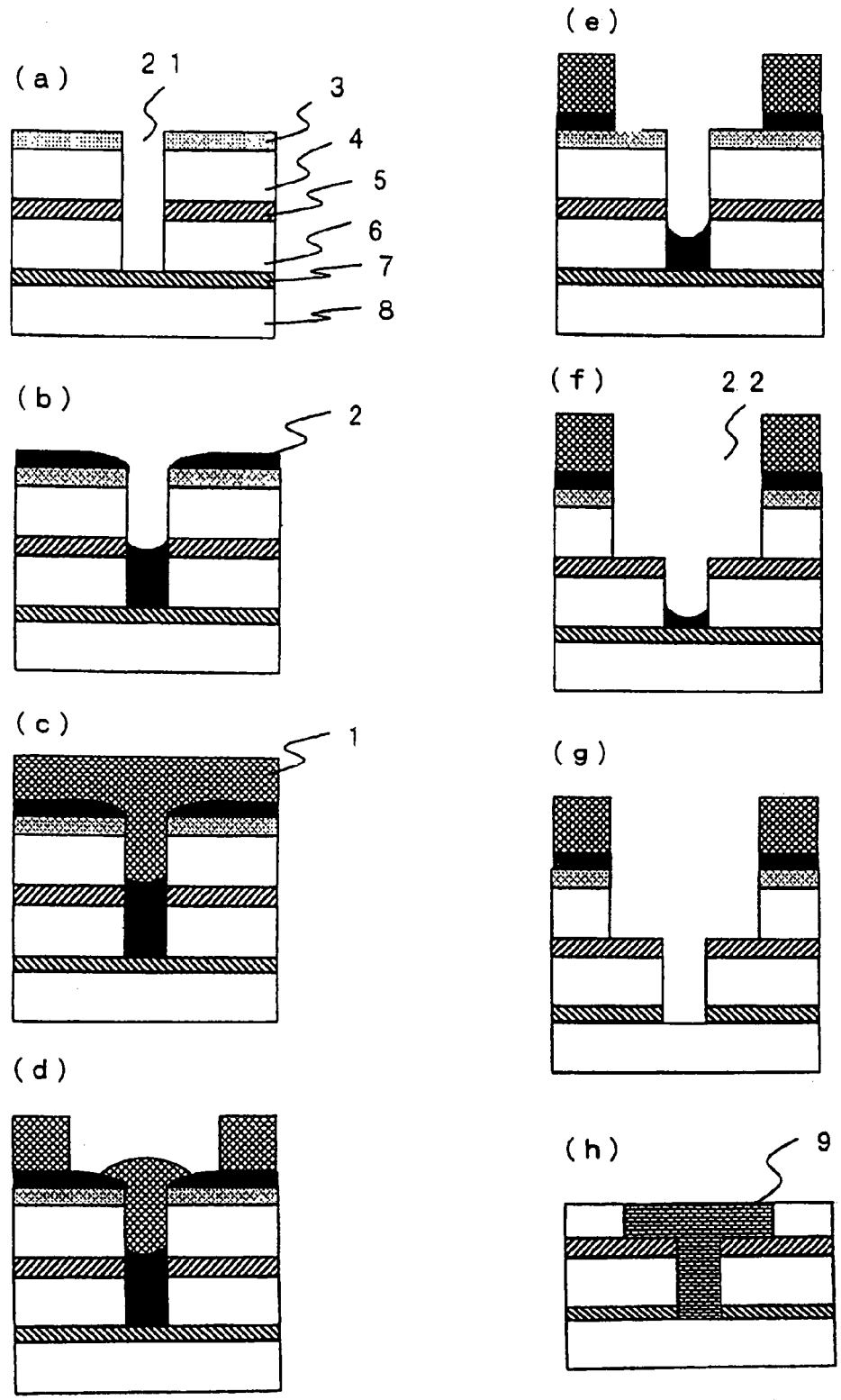
FIG. 1 is a series of schematic cross-sectional views illustrating the steps of a manufacturing method of a semiconductor integrated circuit device wherein a chemically amplified positive resist composition of the present invention is used.
Figure 2:
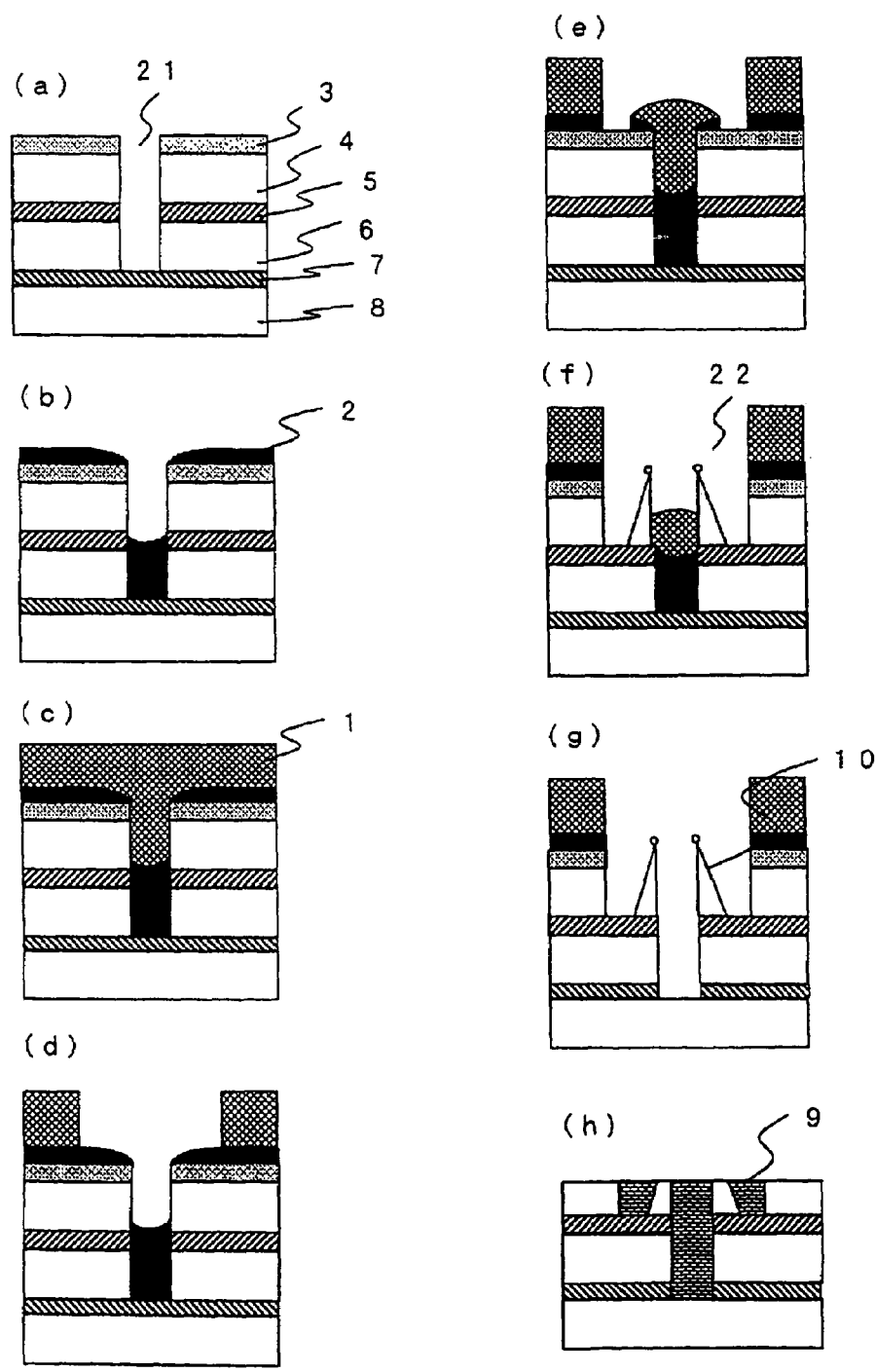
FIG. 2 is a series of schematic cross-sectional views illustrating the steps of a manufacturing method of a semiconductor integrated circuit device wherein a conventional chemically amplified positive resist composition is used.

Numerical reference 1 indicates a photoresist film (resist pattern); 2, an anti-reflection film; 3, a cap film; 4, an interlayer insulating film; 5, an etching barrier film; 6, another interlayer insulating film; 7, another etching barrier film; 8, a Cu lower layer interconnection; 9, a Cu plating layer; 10, a projection; 21, a via hole and 22, an interconnection trench.

DETAILED DESCRIPTION OF THE INVENTION AND PREFERRED EMBODIMENTS

The present inventors found that an acid which is generated from the photo acid generator when the chemically amplified type resist is subjected to the exposure behaves, in the resist, as an acid with a low degree of dissociation, although it is regarded, in an aqueous solution, as a strong acid. As a result, an organic derivative acting as a quencher neutralized the acid generates from the photo acid generator in the resist to form a salt containing a conjugate base for the acid. In effect, following the exposure, there is formed, in the resist, a system of "a weak acid" and "a salt containing its conjugate base", which has the buffering effect.

In consequence, the dissociation of the acid in the resist is controlled and even when impurities of basicity are seeped into the resist from the outside, the basic substances are neutralized by the undissociated acids abundantly present therein so that the change of concentration of the dissociated acid is well suppressed due to the buffering function.

In the conventional cases, only a quencher is added so that "the salt containing a conjugate base" must be formed by the neutralizing reaction between the quencher and the acid that is generated in the resist from the photo acid generator following the exposure.

This necessitates a great amounts of the acids to be generated with a high exposure dose and it was noticed that this is the very reason to lower the exposure sensitivity. In the present invention, together with a quencher, a salt containing a conjugate base with the buffering function to control the change of the acid concentration or a salt with the buffering function is contained in the resist and thereby a chemically amplified type resist for which a rise in the exposure dose is unnecessary is provided.

The present invention can apply both a positive and a negative chemically amplified resist composition as long as a quencher is contained therein.

EXAMPLES

Using a chemically amplified positive resist composition, a photoresist composition of the present Example is described below.

A chemically amplified positive resist composition comprises a base resin, an acid generator, a quencher, a solvent and a salt which is added to control the dissociation of the acid generated from the acid generator.

The base resin in the present Example is a resin where a part of polyhydroxystyrene is protected by an acid labile group (a protecting group; an acetal group) (mentioned below, See Formulae (2)) and this resin having an acid functional group protected by an acid labile group is either insoluble or difficult to be dissolved in an alkaline solution, and becomes alkali-soluble when that acid labile group is eliminated therefrom. The weight average molecular weight (Mw) of this base resin is 10,500. The substitution ratio (the protection ratio) by the acid labile group in this base resin is 30 mol % (phenol type hydroxy group 70 mol %). The polydispersity index (Mw/Mn) for this base resin is 1.1 (Mn is the number average molecular weight). In addition to polyhydroxystyrene, the base resin can be a resin wherein a part of phenol type hydroxy groups in polyhydroxystyrene derivative is protected by an acid labile group. In this case, the weight average molecular weight of this base resin is preferably set 5,000 to 100,000. When it is less than 5,000, its film quality or resolution, may become unsatisfactory. On the other hand, when it exceeds 100,000, its resolution power may become insufficient. For the acid labile group in the base resin, one or more types of groups can be also selected from the group consisting of a group represented by Formula (3) shown below, a group represented by Formula (4) shown below, a tertiary alkyl group containing from 4 to 20 carbons, a trialkylsilyl group whose alkyl groups each contain from 1 to 6 carbons and an oxoalkyl group containing from 4 to 20 carbons. The substitution ratio with the acid labile group in the base resin is preferably 0 to 80 mol % and particularly preferably 12 to 70 mol %. More detailed description for the base resin can be found in Paragraph [0046] to [0075] of Japanese Patent Application Laid-open No. 84639/1999 and Paragraph [0011] to [0017] of Japanese Patent Application Laid-open No. 194776/2001. Further, for the base resin, what is called an ESCAP (Environmentally Stable Chemically Amplified Positive) type polymer (See Japanese Patent Application Laid-open No. 139696/2001) which uses a copolymer made of hydroxystyrene and metacrylic acid esters can be employed but it was found that faulty resolution is more liable to occur than when an acetal protecting group is used. On the other hand, for the purpose of giving a rectangular form and such, it was shown to be effective that a small amount of the ESCAP type polymer is blended into the acetal-based polymer not so far as the resist resolution is worsened. Further, the base resin (polymer material) is not limited to the one used for the KrF excimer laser (wavelength: 248 nm) lithography, but it is considered that the polymer materials suitable to the light sources used for other lithography such as the i-line (wavelength: 365 nm) laser lithography, ArF (wavelength: 193 nm) excimer laser lithography, the F2 excimer laser (wavelength: 157 nm) lithography, the extreme ultraviolet (EUV, wavelength: 157 nm) lithography, the X-ray lithography (wavelength: 0.1-100 nm) and the electron beam (1 KeV-300 KeV) lithography can be chosen to obtain similar effects.

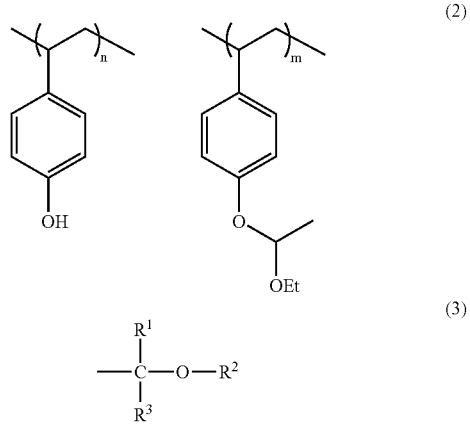

-continued (4)
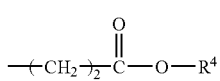

As the acid generator PAGs 1 to 5 (See Formula 5 shown below) are used in the present Example and its amount used (the total amount used) is 1 to 9.6 parts by weight per 100 parts of the base resin by weight. For the acid generator, aside from the PAGs 1 to 5, there can be given onium salts, diazomethane derivatives, glyoxime derivatives, β-ketosulfone derivatives, disulfone derivatives, nitrobenzenesulfonate derivatives, sulfone acid ester derivatives and imidoylsulfonate derivatives. Further, its amount used is preferably 0.2 to 20 parts by weight and more preferably 0.5 to 10 parts by weight per 100 parts of the base resin by weight. When it is less than 0.2 parts by weight, the amount of acid generation on the exposure may be very little and the resolution, low. On the other hand, when it exceeds 20 parts by weight, there may be occasions the resist transmission drops and the resolution deteriorates considerably. More detailed description for the acid generator can be found in Paragraph [0076] to [0084] of Japanese Patent Application Laid-open No. 84639/1999 and Paragraph [0018] to [0028] of Japanese Patent Application Laid-open No. 194776/2001.

(5)
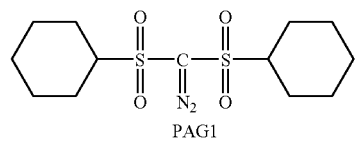
PAG1

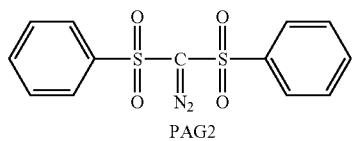
PAG2

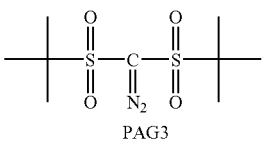
PAG3

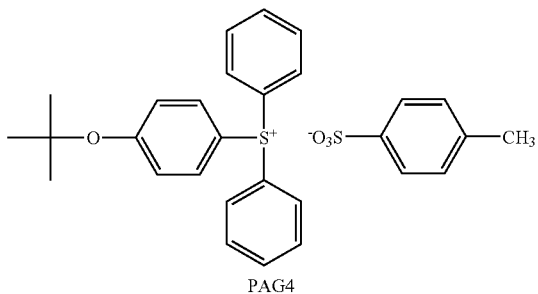
PAG4

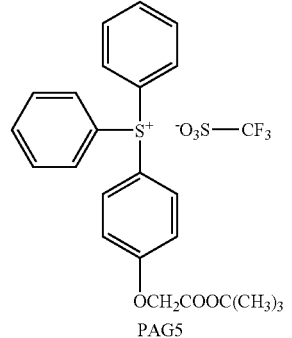
PAG5

As the basic compound (quencher), one or two types of triethanolamine, tri-n-butylamine and 2-butoxypyridine are used in the present Example and its amount of addition is, in the present Example, 10 to 42 mmol of the basic compound per 100 g of the base resin (the unit is, hereinafter, set mmol/poly-1000 g). For the basic compound (quencher), in addition to the above substances, any substance of primary, secondary and tertiary aliphatic amines, mixed amines, aromatic amines, heterocyclic amines, nitrogen-containing compounds with a carboxy group, nitrogen-containing compounds with a sulfonyl group, nitrogen-containing compounds with a hydoxy group, nitrogen-containing compounds with a hydroxyphenyl group, alcoholic nitrogen-containing compounds, amide derivatives and imide derivatives, all of which have been conventionally used, can be employed. Further, the amount of addition for the basic compound (quencher) is preferably 1 to 100 mmol/poly-1000 g and particularly preferably 2 to 50 mmol/poly-1000 g. When it exceeds 1 mmol/poly-1000 g, the acid generates sufficiently on the exposure and the sensitivity is not lowered. When it is less than 6 mmol/poly-1000 g, the sensitivity is not greater than 200 mJ/cm2 and the throughput is not lowered. More detailed description for the type of the basic compounds and such can be found in Paragraph [0027] to [0043] of Japanese Patent Application Laid-open No. 84639/1999 and Paragraph [0008] to [0009] and Paragraph [0030] to [0033] of Japanese Patent Application Laid-open No. 194776/2001.

For the organic solvent, one or two types of propylene glycol monomethyl ether acetate (PGMEA) and ethyl lactate (EL) are used in the present Example and its amount used in the present Example is 600 parts of the solvent by weight per 100 parts of the base resin by weight. As for the organic solvent, in addition to the above solvents, any solvent into which the base resin, the acid generator and such are soluble can be employed, and these examples include, but not limited to, ketones, alcohols, ethers and esters. Each type of these can be used alone or a mixture of two or more types of these may be used. Further, the amount used for the organic solvent is preferably 100 to 5000 parts of the solvent by weight and more preferably 300 to 2000 parts of the solvent by weight per 100 parts of the base resin by weight. As mentioned in more detailed description for the organic solvent in Paragraph

[0044] to [0045] of Japanese Patent Application Laid-open No. 84639/1999 and Paragraph [0010] of Japanese Patent Application Laid-open No. 194776/2001, any organic solvent capable of dissolving an acid generator, a base resin and such can be employed. Examples of such an organic solvent include, but not limited to, ketones such as cyclohexanone and methyl-2-n-amyl ketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether and diethylene glycol dimethyl ethers; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate and propylene glycol mono-tert-butyl ether acetate, which can be used alone or in combination of two or more types thereof. Among these organic solvents preferably used are diethylene glycol dimethyl ether, 1-ethoxy-2-propanol and ethyl lactate which exhibit the highest ability of dissolving an acid generator in a resist composition, and propylene glycol monomethyl ether acetate which is a safe solvent, as well as mixtures thereof.

For a salt with the buffering function to regulate the concentration change of the acid which is generated from the acid generator, a salt derived from an organic sulfonic acid derivative and an organic amine that is a basic compound is chosen. It was demonstrated that the resist material containing the salt has excellent storage stability and coating quality and, with this material, even a considerably long PED (Post Exposure Delay) causes only a small line width variation and little form deterioration, and besides the resist formed on a basic substrate of TiN, SiN, SiCN, SiON or such, hardly tails or very few anomalous bodies are found after the coating, after the development and after the peeling-off. Moreover, the use of this material was shown to produce excellent pattern profile shape after the development, providing high resolution suitable to the microfabrication and, thus, particularly effective in the deep UV lithography.

Specifically, a salt derived from a long chain alkylbenzenesulfonic acid or a long chain alkoxybenzenesulfonic acid, expressed by the following general Formula (1), (1-a) or (1-b), was found to be well suited.

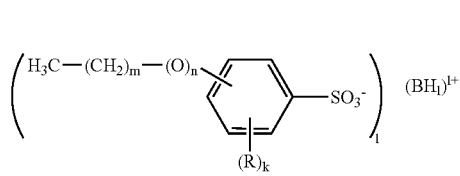

(In the Formula, R each represent, independently with one another, a hydrogen atom or a straight, branched or cyclic alkyl or alkoxy group containing from 1 to 4 carbons with or without substitution. N is 0 or 1, and m is an integer of 3 to 23. k is an integer of 0 to 4. Examples of B include primary, secondary and tertiary aliphatic amines, mixed amines, aromatic amines, heterocyclic amines, nitrogen-containing compounds with a carboxy group, nitrogen-containing compounds with a sulfonyl group, nitrogen-containing compounds with a hydoxy group, nitrogen-containing compounds with a hydroxyphenyl group, alcoholic nitrogen-containing compounds, nitrogen-containing compounds with a cyano group, amide derivatives and imide derivatives. I is an integer of 1 to 3.)

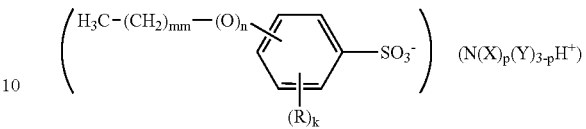

(In the Formula, R each represent, independently with one another, a hydrogen atom or a straight, branched or cyclic alkyl or alkoxy group containing from 1 to 4 carbons with or without substitution. n is 0 or 1 and k is an integer of 0 to 4. mm is an integer of 3 to 11 and p is an integer of 1 to 3. Side chains X can be identical or different and each expressed by one of the following general Formulae (X)-1 to (X)-3. Side chains Y can be identical or different, each representing a hydrogen atom or a straight, branched or cyclic alkyl group containing from 1 to 20 carbons, which may comprise an ether group or a hydroxyl group. Further, Xs may combine with each other to form a ring. Herein, $R^{300}$, $R^{302}$ and $R^{305}$ are each a straight or branched alkylene group containing from 1 to 4 carbons, $R^{301}$ and $R^{304}$ are each a hydrogen atom or a straight, branched or cyclic alkyl group containing from 1 to 20 carbons, which may comprise one or more hydroxy groups, ether groups, ester groups and/or lactone rings. $R^{303}$ is a straight or branched single-bond alkylene group containing from 1 to 4 carbons, and $R^{306}$ is a straight, branched or cyclic alkyl group containing from 1 to 20 carbons, which may comprise one or more hydroxy groups, ether groups, ester groups and/or lactone rings.)

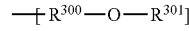

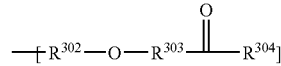

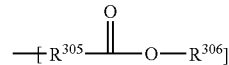

(Ib)

(In the Formula, Rs each represent, independently with one another, a hydrogen atom or a straight, branched or cyclic alkyl or alkoxy group containing from 1 to 4 carbons with or without substitution. N is 0 or 1, and k is an integer of 0 to 4. A side chain X can be expressed by one of the following general Formulae (X)-1 to (X)-3. mm is an integer of 3 to 11 and $R^{307}$ is a straight or branched alkylene group containing from 2 to 20 carbons, which may comprise one or more carbonyl groups, ether groups, ester groups and/or sulfides.)

An acid generated from the photo acid generator is normally a sulfonic acid, and a salt which, being formed from the quencher and the organic peeling agent, permeates into the resist from the outside and causes the lowering of the exposure sensitivity of the resist is an organic amine. As a result, a salt having a buffering function to maintain a pH of the acid generated from the acid generator is preferably a salt made of an acid containing a sulfonic acid and an organic amine.

The present inventors and others found out that a salt of along chain alkylbenzenesulfonic acid or a long chain alkoxybenzenesulfonic acid and an organic amine that is a basic compound is well suited and come to the present invention. For a part expressed by [CH3-(CH2)x-] in the Formulae (1), (1a) and (1b), it is preferable to set x large. x is preferably 3 or greater and more preferably 5 or greater.

Figure 4:
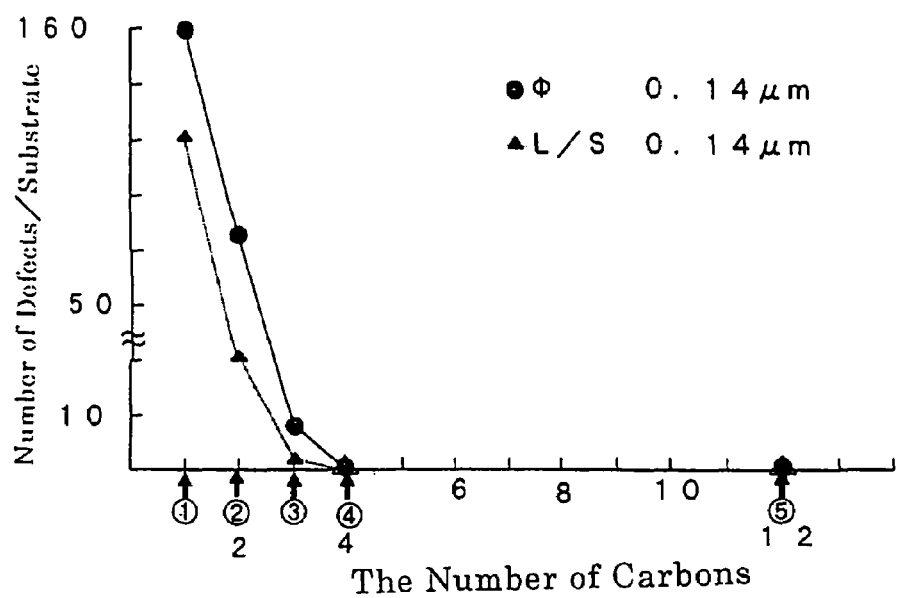
FIG. 4 is a diagram showing the number of defects in the via hole L/S (line and space) pattern for various salts in the 4-n-alkylphenylsulfonic acid tris(2-hydroxyethyl)amine system containing different number of carbons in the acid part.

In FIG. 4, with x of not less than 3, in the resist pattern for the via hole formation, no faulty development in which residual of the hole occurs was observed. However, when the connection test for the upper and lower layer interconnections was conducted after the via hole formation, 0.1% of the connections were recognized to be faulty. With x of not less than 5, no faulty connection was detected.

In effect, if x is made large, an additional surface active effect is given to the salt having the buffer function of a sulfonic acid and an organic amine that is a basic compound so that the number of defects can be reduced.

When the number of oxygen atom is not greater than 1, the residual of the via holes was not detected.

Further, although the buffering function for an imported base over the pH of the acid generated from the acid generator has a tendency to depend on the type of the imported base, if that base is an organic amine contained in an organic peeling agent on the market, for instance, any one of primary, secondary and tertiary aliphatic amines, mixed amines, aromatic amines, heterocyclic amines, nitrogen-containing compounds with a carboxy group, nitrogen-containing compounds with a sulfonyl group, nitrogen-containing compounds with a hydoxy group, nitrogen-containing compounds with a hydroxyphenyl group, alcoholic nitrogen-containing compounds, nitrogen-containing compounds with a cyano group, amide derivatives, imide derivatives and nitrogen-containing compounds which comprise further one or more oxygen atoms, being expressed by the aforementioned Formulae (1), (1a) or (1b), no residual of the via hole or abnormal trench form is observed.

A preferable combination of an acid and a basic compound is as follows. For a long chain alkylbenzenesulfonic acid or a long chain alkoxybenzenesulfonic acid, there can be given 4-n-hexylphenylsulfonic acid, 4-n-octylphenylsulfonic acid, 4-n-decylphenylsulfonic acid, 4-n-dodecylphenylsulfonic acid, 4-(n-hexyloxy)phenylsulfonic acid, 4-(n-octyloxy)phenylsulfonicacid, 4-(n-decyloxy)phenylsulfonic acid, 4-(n-dodecyloxy)phenylsulfonic acid, 3-methyl-4-(n-hexyloxy)phenylsulfonic acid, 3-methyl-4-(n-octyloxy)phenylsulfonic acid, 3-methyl-4-(n-decyloxy)phenylsulfonic acid, 3-methyl-4-(n-dodecyloxy)phenylsulfonic acid, 2-methyl-4-(n-hexyloxy)phenylsulfonic acid, 2-methyl-4-(n-octyloxy)phenylsulfonic acid, 2-methyl-4-(n-decyloxy)phenylsulfonic acid, 2-methyl-4-(n-dodecyloxy)phenylsulfonic acid, 3,5-dimethyl-4-(n-hexyloxy)phenylsulfonic acid, 3,5-dimethyl-4-(n-octyloxy)phenylsulfonic acid, 3,5-dimethyl-4-(n-decyloxy)phenylsulfonic acid, 3,5-dimethyl-4-(n-dodecyloxy)phenylsulfonic acid, 5-isopropyl-2-methyl-4-(n-hexyloxy)phenylsulfonic acid, 5-isopropyl-2-methyl-4-(n-octyloxy)phenylsulfonic acid, 5-isopropyl-2-methyl-4-(n-decyloxy)phenylsulfonic acid and 5-isopropyl-2-methyl-4-(n-dodecyloxy)phenylsulfonic acid. For a basic compound, there can be given tris(2-hydroxyethyl)amine, tris(2-methoxymethoxyethyl)amine, tris(2-acetoxyethyl)amine, tris(2-propionyloxyethyl)amine, tris(2-butyryloxyethyl)amine, tris (2-isobutyryloxyethyl)amine, tris (2-valeryloxyethyl)amine, tris(2-pivaloyloxyethyl)amine, 4-[2-(methoxymethoxy)ethyl]morpholine, 4-[2-[(2-methoxyethoxy)methoxy)ethyl]morpholine, 4-(2-acetoxyethyl)morpholine, 4-(2-pivaloyloxyethyl)morpholine and 4-[2-(ethoxycarbonyloxy)propyl]morpholine. For a salt, there can be given, but not limited to, a combination of the above groups.

The above combinations can be expressed by the Formula (1a) (wherein R each represent, independently with one another, a hydrogen atom or a straight, branched or cyclic alkyl or alkoxy group containing from 1 to 4 carbons with or without substitution. N is 0 or 1, and k is an integer of 0 to 2. Mm is an integer of 5 to 11 and p is an integer of 1 to 3. Side chains X can be identical or different and each expressed by one of the Formulae (X)-1 to (X)-3. Side chains Y each represent, independently with one another, a hydrogen atom or a straight, branched or cyclic alkyl group containing from 1 to 8 carbons, which may comprise an ether bond or a hydroxyl group. Further, Xs may combine with each other to form a ring. Herein, $R^{300}$, $R^{302}$ and $R^{305}$ are each a straight or branched alkylene group containing from 1 to 4 carbons, $R^{301}$ and $R^{304}$ are each a hydrogen atom or a straight, branched or cyclic alkyl group containing from 1 to 8 carbons, which may comprise one or more hydroxy groups, ether bonds, ester bonds and/or lactone rings. $R^{303}$ is a straight or branched single-bond alkylene group containing from 1 to 4 carbons, and $R^{306}$ is a straight, branched or cyclic alkyl group containing from 1 to 8 carbons, which may comprise one or more hydroxy groups, ether bonds and/or ester bonds.) and Formula (1b) (wherein R each represent, independently with one another, a hydrogen atom or a straight, branched or cyclic alkyl or alkoxy group containing from 1 to 4 carbons with or without substitution. n is 0 or 1 and k is an integer of 0 to 2. Side chains X can be identical or different and each expressed by one of the Formulae (X)-1 to (X)-3. mm is an integer of 5 to 11 and $R^{307}$ is a straight or branched alkylene group containing from 2 to 6 carbons, which may comprise one or more carbonyl bonds and/or ether bonds.)

Further, examples of a long chain alkylbenzenesulfonic acid or a long chain alkoxybenzenesulfonic acid include 4-n-butylphenylsulfonic acid, 4-n-pentylphenylsulfonic acid, 4-n-hexylphenylsulfonic acid, 4-n-heptylphenylsulfonic acid, 4-n-octylphenylsulfonic acid, 4-n-nonylphenylsulfonic acid, 4-n-decylphenylsulfonic acid, 4-n-undecylphenylsulfonic acid, 4-n-dodecylphenylsulfonic acid, 4-n-tridecylphenylsulfonic acid, 4-n-tetradecylphenylsulfonic acid, 4-n-pentadecylphenylsulfonic acid, 4-n-hexadecylphenylsulfonic acid, 4-n-heptadecylphenylsulfonic acid, 4-n-octadecylphenylsulfonic acid, 4-n-nonadecylphenylsulfonic acid, 4-n-icosylphenylsulfonic acid, 4-n-henicosylphenylsulfonic acid, 4-n-docosylphenylsulfonic acid, 4-n-tricosylphenylsulfonic acid, 4-n-tetracosylphenylsulfonic acid, 4-(n-butyloxy)phenylsulfonic acid, 4-(n-pentyloxy)phenylsulfonic acid, 4-(n-hexyloxy)phenylsulfonic acid, 4-(n-heptyloxy)phenylsulfonic acid, 4-(n-octyloxy)phenylsulfonic acid, 4-(n-nonyloxy)phenylsulfonic acid, 4-(n-decyloxy)phenylsulfonic acid, 4-(n-undecyloxy)phenylsulfonic acid, 4-(n-dodecyloxy)phenylsulfonic acid, 4-(n-tridecyloxy)phenylsulfonic acid, 4-(n-tetradecyloxy)phenylsulfonic acid, 4-(n-pentadecyloxy)phenylsulfonic acid, 4-(n-hexadecyloxy)phenylsulfonic acid, 4-(n-heptadecyloxy)phenylsulfonic acid, 4-(n-octadecyloxy)phenylsulfonic acid, 4-(n-nonadecyloxy)phenylsulfonic acid, 4-(n-icosyloxy)phenylsulfonic acid, 4-(n-henicosyloxy)phenylsulfonic acid, 4-(n-docosyloxy)phenylsulfonic acid, 4-(n-tricosyloxy)phenylsulfonic acid, 4-(n-tetracosyloxy)phenylsulfonic acid, 3-methyl-4-(n-butyloxy)phenylsulfonic acid, 3-methyl-4-(n-pentyloxy)phenylsulfonic acid, 3-methyl-4-(n-hexyloxy)

phenylsulfonic acid, 3-methyl-4-(n-heptyloxy)phenylsulfonic acid, 3-methyl-4-(n-octyloxy)phenylsulfonic acid, 3-methyl-4-(n-nonyloxy)phenylsulfonic acid, 3-methyl-4-(n-decyloxy)phenylsulfonic acid, 3-methyl-4-(n-undecyloxy)phenylsulfonic acid, 3-methyl-4-(n-dodecyloxy)phenylsulfonic acid, 3-methyl-4-(n-tridecyloxy)phenylsulfonic acid, 3-methyl-4-(n-tetradecyloxy)phenylsulfonic acid, 3-methyl-4-(n-pentadecyloxy)phenylsulfonic acid, 3-methyl-4-(n-hexadecyloxy)phenylsulfonic acid, 3-methyl-4-(n-heptadecyloxy)phenylsulfonic acid, 3-methyl-4-(n-octadecyloxy)phenylsulfonic acid, 3-methyl-4-(n-nonadecyloxy)phenylsulfonic acid, 3-methyl-4-(n-icosyloxy)phenylsulfonic acid, 3-methyl-4-(n-henicosyloxy)phenylsulfonic acid, 3-methyl-4-(n-docosyloxy)phenylsulfonic acid, 3-methyl-4-(n-tricosyloxy)phenylsulfonic acid, 3-methyl-4-(n-tetracosyloxy)phenylsulfonic acid, 2-methyl-4-(n-butyloxy)phenylsulfonic acid, 2-methyl-4-(n-pentyloxy)phenylsulfonic acid, 2-methyl-4-(n-hexyloxy)phenylsulfonic acid, 2-methyl-4-(n-heptyloxy)phenylsulfonic acid, 2-methyl-4-(n-octyloxy)phenylsulfonic acid, 2-methyl-4-(n-nonyloxy)phenylsulfonic acid, 2-methyl-4-(n-decyloxy)phenylsulfonic acid, 2-methyl-4-(n-undecyloxy)phenylsulfonic acid, 2-methyl-4-(n-dodecyloxy)phenylsulfonic acid, 2-methyl-4-(n-tridecyloxy)phenylsulfonic acid, 2-methyl-4-(n-tetradecyloxy) phenylsulfonic acid, 2-methyl-4-(n-pentadecyloxy) phenylsulfonic acid, 2-methyl-4-(n-hexadecyloxy) phenylsulfonic acid, 2-methyl-4-(n-heptadecyloxy) phenylsulfonic acid, 2-methyl-4-(n-octadecyloxy) phenylsulfonic acid, 2-methyl-4-(n-nonadecyloxy) phenylsulfonic acid, 2-methyl-4-(n-icosyloxy) phenylsulfonic acid, 2-methyl-4-(n-henicosyloxy) phenylsulfonic acid, 2-methyl-4-(n-docosyloxy) phenylsulfonic acid, 2-methyl-4-(n-tricosyloxy) phenylsulfonic acid, 2-methyl-4-(n-tricosyloxy) phenylsulfonic acid, 3,5-dimethyl-4-(n-butyloxy) phenylsulfonic acid, 3,5-dimethyl-4-(n-pentyloxy) phenylsulfonic acid, 3,5-dimethyl-4-(n-hexyloxy) phenylsulfonic acid, 3,5-dimethyl-4-(n-heptyloxy) phenylsulfonic acid, 3,5-dimethyl-4-(n-octyloxy) phenylsulfonic acid, 3,5-dimethyl-4-(n-nonyloxy) phenylsulfonic acid, 3,5-dimethyl-4-(n-decyloxy) phenylsulfonic acid, 3,5-dimethyl-4-(n-undecyloxy) phenylsulfonic acid, 3,5-dimethyl-4-(n-dodecyloxy) phenylsulfonic acid, 3,5-dimethyl-4-(n-tridecyloxy) phenylsulfonic acid, 3,5-dimethyl-4-(n-tetradecyloxy) phenylsulfonic acid, 3,5-dimethyl-4-(n-pentadecyloxy) phenylsulfonic acid, 3,5-dimethyl-4-(n-hexadecyloxy) phenylsulfonic acid, 3,5-dimethyl-4-(n-heptadecyloxy) phenylsulfonic acid, 3,5-dimethyl-4-(n-octadecyloxy) phenylsulfonic acid, 3,5-dimethyl-4-(n-nonadecyloxy) phenylsulfonic acid, 3,5-dimethyl-4-(n-icosyloxy) phenylsulfonic acid, 3,5-dimethyl-4-(n-henicosyloxy) phenylsulfonic acid, 3,5-dimethyl-4-(n-docosyloxy) phenylsulfonic acid, 3,5-dimethyl-4-(n-tricosyloxy) phenylsulfonic acid, 3,5-dimethyl-4-(n-tetracosyloxy) phenylsulfonic acid, 5-isopropyl-2-methyl-4-(n-butyloxy) phenylsulfonic acid, 5-isopropyl-2-methyl-4-(n-pentyloxy) phenylsulfonic acid, 5-isopropyl-2-methyl-4-(n-hexyloxy) phenylsulfonic acid, 5-isopropyl-2-methyl-4-(n-heptyloxy) phenylsulfonic acid, 5-isopropyl-2-methyl-4-(n-octyloxy) phenylsulfonic acid, 5-isopropyl-2-methyl-4-(n-nonyloxy) phenylsulfonic acid, 5-isopropyl-2-methyl-4-(n-decyloxy) phenylsulfonic acid, 5-isopropyl-2-methyl-4-(n-undecyloxy) phenylsulfonic acid, 5-isopropyl-2-methyl-4-(n-dodecyloxy) phenylsulfonic acid, 5-isopropyl-2-methyl-4-(n-tridecyloxy) phenylsulfonic acid, 5-isopropyl-2-methyl-4-(n-tetradecyloxy) phenylsulfonic acid, 5-isopropyl-2-methyl-4-(n-pentadecyloxy) phenylsulfonic acid, 5-isopropyl-2-methyl-4-(n-hexadecyloxy)phenylsulfonic acid, 5-isopropyl-2-methyl-4-(n-heptadecyloxy)phenylsulfonic acid, 5-isopropyl-2-methyl-4-(n-octadecyloxy)phenylsulfonic acid, 5-isopropyl-2-methyl-4-(n-nonadecyloxy)phenylsulfonic acid, 5-isopropyl-2-methyl-4-(n-icosyloxy)phenylsulfonic acid, 5-isopropyl-2-methyl-4-(n-henicosyloxy) phenylsulfonic acid, 5-isopropyl-2-methyl-4-(n-docosyloxy) phenylsulfonic acid, 5-isopropyl-2-methyl-4-(n-tricosyloxy) phenylsulfonic acid, 5-isopropyl-2-methyl-4-(n-tetracosyloxy)phenylsulfonic acid, 2-(n-butyloxy)-5-methylphenylsulphonic acid, 2-(n-butyloxy)-5-ethyphenylsulphonic acid, 2-(n-butyloxy)-5-isopropylphenylsulphonic acid, 2-(n-hexyloxy)-5-methylphenylsulphonic acid, 2-(n-hexyloxy)-5-ethylphenylsulphonic acid, 2-(n-hexyloxy)-5-isopropylphenylsulphonic acid, 2-(n-hexyloxy)-5-tert-butylphenylsulphonic acid, 2-(n-hexyloxy)-5-cyclohexylphenylsulphonic acid, 2-(n-octyloxy)-5-methylphenylsulphonic acid, 2-(n-dodecyloxy)-5-methylphenylsulphonic acid, 2,4-(n-butyloxy) phenylsulphonic acid, 2,5-(n-butyloxy)phenylsulphonic acid, 2-methyl-4,5-(n-butyloxy)phenylsulphonic acid and 2-methyl-4,5-(n-hexyloxy)phenylsulphonic acid.

As an organic amine that is a basic compound, examples of a primary alipatic amine include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine and tetraethylenepentamine, and examples of a secondary aliphatic amine include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine and N,N-dimethyltetraethylenepentamine, and examples of a tertiary aliphatic amine include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine and N,N,N',N'-tetramethyltetraethylenepentamine.

There can be given, for mixed amines, dimethylethylamine, methylethylpropylamine, benzylamine, phenethylamine and benzyldimethylamine; for aromatic amines and heterocyclic amines, aniline derivatives (such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline and N,N-dimethyltoluidine), diphenyl(p-tolyl)amine, methyldiphenylamine, triphenylamine, phenylenediamine, naphthylamine, diaminonaphthalene, pyrrole derivatives (such as pyrrole, 2H-pyrrole, 1-methylpyrrole, 2,4-dimethylpyrrole, 2,5-dimethylpyrrole, N-methylpyrrole), oxazole derivatives (such as oxazole and isoxazole), thiazole derivatives (such as thiazole and isothiazole), imidazole derivatives (such as imidazole, 4-methylimidazole and 4-methyl-2-phenylimidazole), pyrazole derivatives, furazane derivatives, pyrroline derivatives (such as pyrroline and 2-methyl-1-pyrroline), pyrrolidine derivatives (such as pyrrolidine, N-methlpyrrolidine, pyrrolidinone and N-methylpyrrolidone), imidazoline derivatives, imidazolidine derivatives, pyridine derivatives (such as pyridine., methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (such as quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives and uridine derivatives. There can be given, for nitrogen-containing compounds with a carboxy group, aminobenzoic acid, indolecarboxylic acid, amino acid derivatives (such as nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid and methoxyalanine); for nitrogen-containing compounds with a sulfonyl group, 3-pyridinesulfonic acid; for nitrogen-containing compounds with a hydroxy group, nitrogen-containing compounds with a hydroxyphenyl group and alcoholic nitrogen-containing compounds, 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxypyrrolidine, 3-quinuclidinol, 3-tropanol, 1-methyl-2-pyrrolizineethanol, 1-aziridineethanol, N-(2-hydroxyethyl)phthalimide and N-(2-hydroxyethyl)isonicotinamide; and for nitrogen-containing compounds with a cyano group, 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-methoxymethoxy]ethyl)aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate and 2-cyanoethyl 4-morpholinepropionate; for amide derivatives, formamide, N-methylformamide, N,N-diimethylformamide, acetamide, N-methylacetamide, N,N-dimethylacetamide, propionamide and benzamide; and for imide derivatives, phthalimide, succinimide and maleimide.

Further, there can be given, for nitrogen-containing compounds which comprises one or more oxygen atoms, tris(2-hydroxyethyl)amine, tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8,8,8]hexacosane, 4,7,13,18-tetraoxa-1,10-diazabicyclo[8,5,5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)2-(methoxycarbonyl)ethylamine, N,N-bis (2-acetoxyethyl)2-(methoxycarbonyl)ethylamine, N,N-bis(2-hydroxyethyl)2-(2-ethoxycarbonyl)ethylamine, N,N-bis(2-acetoxyethyl)2-(2-ethoxycarbonyl)ethylamine, N,N-bis(2-hydroxyethyl)2-(2-methoxyethoxycarbonyl)ethylamine, N,N-bis(2-acetoxyethyl)2-(2-methoxyethoxycarbonyl)ethylamine, N,N-bis(2-hydroxyethyl)2-(2-hydroxyethoxycarbonyl)ethylamine, N,N-bis(2-acetoxyethyl)2-(2-acetoxyethoxycarbonyl)ethylamine, N,N-bis(2-hydroxyethyl)2-[(methoxycarbonyl) methoxycarbonyl]ethylamine, N,N-bis(2-acetoxyethyl)2-[(methoxycarbonyl) methoxycarbonyl]ethylamine, N,N-bis(2-hydroxyethyl)2-(2-oxopropoxycarbonyl)ethylamine, N,N-bis(2-acetoxyethyl)2-(2-oxopropoxycarbonyl)ethylamine, N,N-bis(2-hydroxyethyl)2-(tetrahydrofurfuryloxycarbonyl) ethylamine, N,N-bis (2-acetoxyethyl)2-(tetrahydrofurfuryloxycarbonyl)ethylamine, N,N-bis(2-hydroxyethyl)2-[(2-oxotetrahydrofuran-3-yl)oxycarbonyl]ethylamine, N,N-bis(2-acetoxyethyl)2-[(2-oxotetrahydrofuran-3-yl)oxycarbonyl]ethylamine, N,N-bis(2-hydroxyethyl)2-(4-hydroxybutoxycarbonyl)ethylamine, N,N-bis(2-formyloxyethyl)2-(4-formyloxybutoxycarbonyl) ethylamine, N,N-bis (2-formyloxyethyl)2-(2-formyloxyethoxycarbonyl)ethylamine, N,N-bis(2-methoxyethyl)2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyliamine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine andp-(diethylamine)-6-valerolactone. Further examples include 4-(2-acetoxyethyl)morpholine, 4-(2-pivaloyloxyethyl)morpholine, 4-[2-(ethoxycarbonyloxy)propyl]morpholine, 1-[2-(methoxymethoxy)ethyl]pyrrolid ine, 1-[2-(methoxymethoxy)ethyl]piperidine, 4-[2-(methoxymethoxy)ethyl]morpholine, 1-[2-[(2-methoxyethoxy) methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl] piperidine, 4-[2-(2-methoxyethoxycarbonyloxy)ethyl]morpholine, methyl 3-(1-pyrrolidinyl) propionate, methyl 3-piperidinoproprionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofurfuryl-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-β-butyrolactone, 3-piperidino-β-butyrolactone, 3-morpholino-δ-valerolactone, methyl 1-pyrrolidinylacetate, methyl piperidinoacetate, methyl morphonolinoacetate, methyl thiomorpholinoacetate, ethyl 1-pyrrolidinylacetate and 2-methoxyethyl morpholinoacetate. For a salt, there can be given, but not limited to, a combination of these groups.

These salts can be expressed by the Formula (1a) (wherein Reach represent, independently with one another, a hydrogen atom or a straight, branched or cyclic alkyl or alkoxy group containing from 1 to 4 carbons with or without substitution. n is 0 or 1 and k is an integer of 0 to 2. mm is an integer of 5 to 11 and p is an integer of 1 to 3. Sidechains X can be identical or different and each expressed by one of the Formulae (X)-1 to (X)-3. Side chains Y each represent, independently with one another, a hydrogen atom or a straight, branched or cyclic alkyl group containing from 1 to 8 carbons, which may comprise an ether bond ora hydroxyl group. Further, Xs may combine with each other to form a ring. Herein, $R^{300}$, $R^{302}$ and $R^{305}$ are each a straight or branched alkylene group containing from 1 to 4 carbons, $R^{301}$ and $R^{304}$ are each a hydrogen atom or a straight, branched or cyclic alkyl group containing from 1 to 8 carbons, which may comprise one or more hydroxy groups, ether bonds, ester bonds and/or lactone rings. $R^{303}$ is a straighter branched single-bond alkylene group containing from 1 to 4 carbons, and $R^{306}$ is a straight, branched or cyclic alkyl group containing from 1 to 8 carbons, which may comprise one or more hydroxy groups, ether bonds and/or ester bonds.) and Formula (1b) (wherein Rs each represent, independently with one another, a hydrogen atom or a straight, branched or cyclic alkyl or alkoxy group containing from 1 to 4 carbons with or without substitution. n is 0 or 1 and k is an integer of 0 to 2. A side chain X can be expressed by one of the Formulae (X)-1 to (X)-3. mm is an integer of 5 to 11 and $R^{307}$ is a straight or branched alkylene group containing from 2 to 6 carbons, which may comprise one or more carbonyl bonds and/or ether bonds.)

The amount of addition for a salt of this sort is preferably not less than one time but not greater than twenty times and more preferably not less than twice but not greater than ten times the amount of addition for the quencher.

When the amount not less than one time the amount of addition for the quencher is added, the effect of the resist poisoning can be reduced and the resolution does not deteriorate. If it is not greater than twenty times that, residual or faulty shape does not occur.

Now, referring to a series of schematic cross-sectional views of a substrate illustrating the steps of a manufacturing method of a semiconductor integrated circuit device wherein the afore-mentioned chemically amplified positive resist composition is used, a manufacturing method of the present invention is described.

This method comprises the step wherein, using a chemically amplified positive resist composition into which a salt of the present invention is added 5 times as much as the amount of a quencher, a resist film (1 of FIG. 1(c)) is formed on a substrate (a semiconductor substrate) having a stepped part (21 of FIG. 1(a)), and, by applying the exposure onto a prescribed region of that resist film, a resist pattern (1 of FIG. 1(c)) is formed, and this enables to form a resist pattern of good quality even if the photoresist is subjected to the poisoning by the poisoning component of the organic peeling agent, which may be left in the vicinity of the stepped part by the adhesion or such, since a basic compound in the resist buffers to prevent the concentration of the acidic catalyst from falling fast and to allow the resist in the exposed section to undergo efficient transformation that changes its solubility in the resist developer solution, that is, to a higher solubility (in the case of the positive resist) and to a lower solubility (in the case of the negative resist).

First, on a substrate surface where a Cu lower layer interconnection is formed, the Cu lower layer interconnection being exposed, an etching barrier film 7 (SiCN; 70 nm in thickness), a first interlayer insulating film 6 (SiO2; 250 to 400 nm in thickness), an etching barrier film 5 (SiC; 50 nm in thickness), a second interlayer insulating film 4 (a silicon oxide film or a Low-k film; 200 nm in thickness) and a cap film (SiO2; 150 nm in thickness) are formed in this order from the side of the substrate by the CVD (Chemical Vapor Deposition) method or the spin coating method (the step A1; See FIG. 1(a)).

For the cap film 3, herein, in addition to a SiO2 film, a CMP stopper film of SiN, SiC, SiON, SiCN or such can be also used.

As the second interlayer insulating film 4, a silicon oxide film or a Low-k film (such as a HSQ(HydrogenSilsesQuioxane) or a Si—H containing SiO2 film; grown by the coating method; the dielectric constant k<3.0) is, in the present Example, utilized, but, not limited to this, other Low-k films including inorganic insulating films of SiOF, SiOB, BN, SiOC, porous silica films and organic insulating films such as SiO2 films containing a methyl group, polyimide based films, parylene based films, polytetrafluoroethylene based films, other copolymer films and fluorine-doped amorphous carbon films may be also used.

For the etching barrier film 5, besides a SiC film, a film of SiN, SiON, SiCN or such can be used.

For the first interlayer insulating film 6, like the second interlayer insulating film 4, a Low-k film can be used, in addition to a SiO2 film.

As the etching barrier film 7, SiC, SiN, SiON or such can be used, in addition to SiCN. However, in the case that etching is made by a difference in etching selection ratio, a different material from that of the etching barrier film 5 must be employed.

Next, onto the surface of the cap film 3, a coating of a composition for anti-reflection film formation is applied (by means of spin-coating), and by carrying out the pre-bake at 200° C. for 90 seconds, an anti-reflection film is formed to a thickness of 50 nm (the step A2). After that, onto the surface of this anti-reflection film, a coating (spin-coating) of a photoresist composition (a chemically amplified positive photoresist composition) is applied, and by carrying out the pre-bake with a hot plate at 95° C. for 90 seconds, a photoresist film is formed to a thickness of 400 nm (the step A3). Subsequently, the substrate on which the photoresist film (chemically amplified positive photoresist) is grown is subjected to the exposure with an optimal exposure dose and focus, using a KrF excimer laser scanner (NSR-S204B; manufactured by NikonCo.), and, being post-baked at 105° C. for 90 seconds immediately after the exposure, developed for 60 seconds in a developer solution that is a 2.38 wt. % aqueous solution of tetramethylammonium hydroxide (the step A4). A resist pattern for via hole formation is thereby obtained.

The composition for anti-reflection film formation is herein employed a composition for anti-reflection film formation (Japanese Patent Application Laid-open No. 92122/2001) manufactured by Tokyo Ohka Kogyo Co., Ltd. or a composition for the anti-reflection film formation (WO No. 01752/2000) manufactured by Clariant (Japan) K. K., both of which contain a polymer material, an optical absorption agent (optical absorption site), an acidic catalyst and an organic solvent.

Next, the substrate wherein the resist pattern for via hole formation is formed is subjected to the dry etching (the plasma etching) so that the first anti-reflection film, the cap film 3, the second interlayer insulating film 4, the second etching barrier film 5 and the first interlayer insulating film 6 may be selectively etched in succession till the first etching barrier film 7 is exposed (the step A5), and thereby a via hole (($\phi$ 0.2 μm) is formed (See FIG. 1(a)).

Next, by performing first plasma ashing and then using an organic peeling agent, the resist pattern for via hole formation is removed from the substrate where the via hole formation is completed (the step A6). The cross-section of the substrate is hereat in the state shown in FIG. 1(a).

Figure 3:
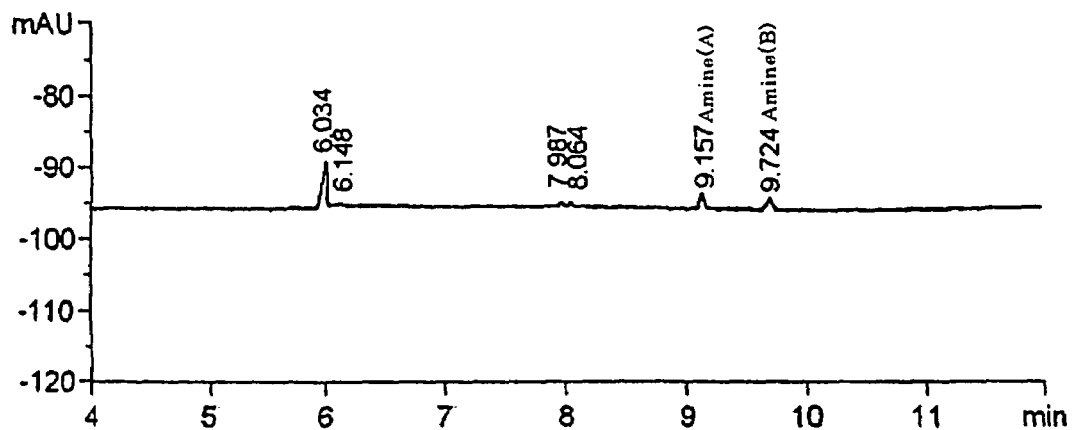
FIG. 3 is a pair of graphs showing results of the capillary electrophoresis method, identifying components attached onto the substrate of Example with Low-k films after the treatment with the organic peeling agent.
Figure 3:
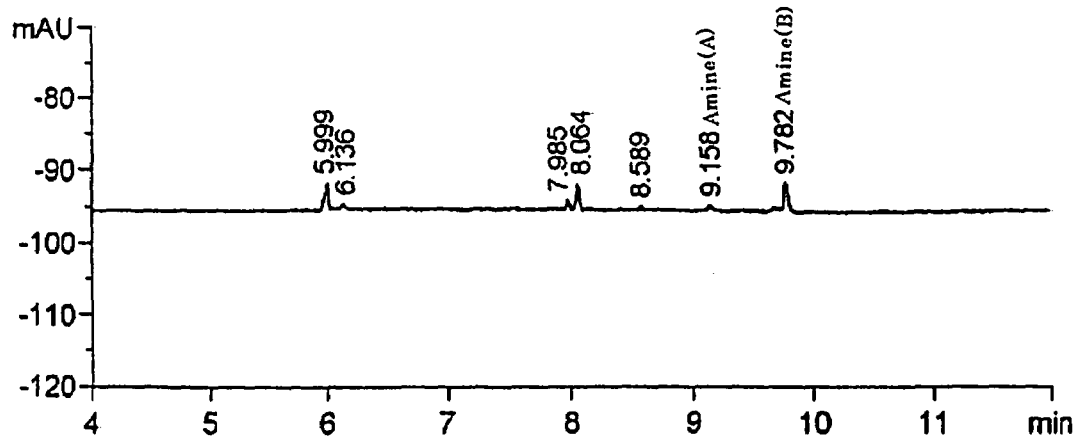

At this very moment, an amine component contained in the organic peeling agent is attached (adsorbed) on or seeped into the interlayer insulating films 4 and 6 which are exposed within the via hole. The result of component identification conducted at this moment (after drying) for the components attached onto the first interlayer insulating film 4 and the second interlayer insulating film 6 is shown in FIG. 3. FIG. 3 is a pair of graphs showing a result of the component identification in which components attached onto the substrate with Low-k films are extracted into pure water after the step A6 of Example 1 and identified by the capillary electrophoresis method (electrophelogram), together with the result of component identification for the organic peeling agent for comparison. The exact components of the organic peeling agent is not disclosed, but a comparison between the graph for the organic peeling agent components and the graph for the components attached onto the substrate shows the positions of their peaks well coincide, indicating that the organic peeling agent remains attached onto the substrate, even after the resist is peeled off and dried.

It is a hard task to remove amine components from the first interlayer insulating film 4 and the second interlayer insulating film 6 by cleaning and such, once they are attached thereon. In some cases, certain heat treatments or the like are conducted for the purpose of reducing the amount of amine components attached onto the first interlayer insulating film 4 and the second interlayer insulating film 6, but it is technically difficult to remove amine components thoroughly due to restriction on the temperature imposed for other interconnection layers. The organic peeling agent used herein is a mixed organic alkaline solution on the market, and thought to contain amine components such as ethylenediamine, monoethanolamine, methylamine, triethanolamine and methylmonoethanolamine, but its exact chemical composition is not disclosed. Some description of amine components contained in organic peeling agents can be found in Japanese Patent Application Laid-open No. 331.541/1994, Japanese Patent Application Laid-open No. 226696/2001 and Japanese Patent Application Laid-open No. 89488/2000.

Next, a coating (spin-coating) of a composition for anti-reflection film formation is applied onto the substrate surface from which the resist pattern for via hole formation has been removed, and by carrying out the pre-bake at 200° C. for 90 seconds, an anti-reflection film 2 is formed to a thickness of 50 nm (the film thickness on the surface of the cap film 3) (the step A7). This provides the anti-reflection film over the surface of the sidewall of the via hole very thinly, while the anti-reflection film accumulates thick at the bottom of the via hole (the via hole is not entirely filled up) (See FIG. 1(b)).

Hereat, in carrying out the pre-bake of the anti-reflection film 2, some amine components attached onto the first interlayer insulating film 4 and the second interlayer insulating film 6 may be released into the air, but it is considered that a good deal of amine components remain attached onto the first interlayer insulating film 4 and the second interlayer insulating film 6 or present in the anti-reflection film 2. This anti-reflection film 2 is made of the same material as the aforementioned anti-reflection film used for via hole formation.

Next, a coating (spin-coating) of a photoresist composition (a chemically amplified positive photoresist composition) is applied onto the surface of the anti-reflection film 2, and by carrying out the pre-bake with a hot plate at 95° C. for 90 seconds, a photoresist film 1 is formed to a thickness of 400 nm (the film thickness on the surface of the cap film 3) (the step A8). In this way, the photoresist film 1 is formed to fill up the via hole (See FIG. 1(c)).

At the time of the pre-bake performed for the photoresist 1, the amine components which remain attached onto the first interlayer insulating film 4 and the second interlayer insulating film 6 or present in the anti-reflection film 2 may permeate into the photoresist 1, passing through the anti-reflection film 2. The original liquid employed for the photoresist 1 is the same as the one for the photoresist (chemically amplified positive photoresist composition) for via hole formation.

Next, the substrate on which the photoresist film 1 is formed is subjected to the exposure with an optimal exposure dose and focus, using the KrF excimer laser scanner (NSR-S204B; manufactured by Nikon Co.), and, being post-baked at 105° C. for 90 seconds immediately after the exposure, developed for 60 seconds in a developer solution that is a 2.38 wt. % aqueous solution of tetramethylammonium hydroxide (the step A9). A resist pattern for interconnection trench formation (a resist pattern having, on the substrate, an opening section in the region which includes the lateral face of the wall of the stepped part) is thereby obtained (See FIG. 1(d)).

Herein, in contrast with the case wherein a conventional photoresist is used, any photoresist which may cause resolution defects does not remain within the via hole or in its vicinity, and the exposed photoresist can be removed with the developer solution.

On exposure, generation of acids takes place. It is considered that the acids are not necessarily completely dissociated in the solid, but dissociated with a certain degree of dissociation. In general, the dissociation constant of the acid in the solid (in the resist) is thought to be low. When a salt of an organic sulfonic acid derivative that comprises a conjugate base for the acid to be generated and an organic amine that is a basic compound is added as an additive for the buffering effect, the acid dissociation equilibrium shifts towards the non-dissociation, owing to the presence of the conjugate base. In this condition, even if impurities of basicity such as amines permeates into the photoresist from the outside, the basic substances such as amines are neutralized by the nondissociated acids abundantly present therein. Therefore, the change of concentration of the acids acting as effective catalyst (dissociated acids) is small. Even if the dissociated acids are neutralized, the acid dissociation equilibrium shifts towards the dissociation so that the change of concentration of the acids acting as effective catalyst (dissociated acids) is small. When impurities of strong acidity enter, the buffering action takes place, as negative ions of the salt neutralize the acids.

Further, with the buffering effect functioning, the pH of the resist is less affected by the fluctuation of the exposure dose (that is, the amount of the generated acids) and, therefore, the margin against the exposure dose increases.

Next, the substrate where the formation of the resist pattern for interconnection trench pattern is completed is etched by the dry etching method from the top surface layer so as to etch selectively the second anti-reflection film 2, the cap film 3, the second interlayer insulating film 4, in succession, till the second etching barrier film 5 is exposed (the step A10), and thereby an interconnection trench 22 is formed (See FIGS. 1(e) and (f)).

Next, from the substrate where the interconnection trench formation is completed, the resist pattern for resist pattern formation is removed by performing first plasma ashing and then using an organic peeling agent (the step A11).

Next, in the substrate from which the resist pattern for interconnection trench formation has been removed, the exposed etching barrier film 7 is etched by the etch back method, till the Cu lower layer interconnection layer 8 is exposed (the step A12). This leaves the cross-section of the substrate in the state shown in FIG. 1(g).

Finally, after cleaning the substrate where a part of the Cu lower layer interconnection layer is exposed, a Cu plating film 9 is grown on the substrate surface by the CVD method (so as to fill up the via hole and the interconnection trench), and then the planarization is carried out by the CMP (till the second interlayer insulating film 4 is exposed) (the step A13). A dual damascene interconnection 9 that is electrically connected with the Cu lower layer interconnection layer 8 is thereby formed (See FIG. 1(h)).

In the present Example, the photoresist within the via hole 21 can be resolved well by irradiation and does not remain after the treatment with the developer solution (See FIG. 1(d)).

Next, the relationship between the composition of the chemically amplified positive photoresist and the trimming quality or the form of the via hole was investigated.

For the substrate 1, the same manufacturing method as the trench interconnection structure shown in FIG. 1 was used. The parameters for the substrate and such are shown in Table 1. For the substrate 2, after a HSQ film, 300 nm thick, was formed on a silicon substrate and subsequent treatments of organic peeling-off and heat treatment (at 350° C., for 30 minutes) were conducted, a photoresist 400 nm thick (after the pre-bake) was formed and then a via hole with φ of 0.14 μm and a 0.14 μm L/S (line and space pattern) were formed. The substrate 3 was manufactured in the same way as the substrate 2 except that a TiN film 200 nm thick was used in place of the HSQ film on the substrate 2.

While a silicon oxide film was herein used as a typical a Low-k film of porous film quality, it is obvious that other Low-k films including inorganic insulating films of SiOF, SiOB, BN, SiOC, porous silica films and organic insulating films such as $SiO2$ films containing a methyl group, polyimide based films, parylene based films, polytetrafluoroethylene based films, other copolymer films and fluorine-doped amorphous carbon films may be also used.

TABLE 1

| | Substrate1 |
|---|---|
| Photoresist | Refer Table 2/400 nm |
| Anti-Reflection Film2 | Tokyo Ohka Kogyo Co., Ltd./50 nm |
| Cap Film3 | $SiO_2$/150 nm |
| Interlayer Insulating Film4 | HSQ/200 nm |
| Etching Barrier Film5 | SiC/50 nm |
| Interlayer Insulating Film6 | $SiO_2$/250 nm |
| Etching Barrier Film6 | SiCN/70 nm |
| Heat Treatment | 350 ㊅/30 min. |
| Via Hole Diameter | φ0.14 μm, L/S 0.14 μm |

TABLE 2

| Sample | Base Resin (Part by Weight) | Acid Generator (1) (Part by Weight) | Acid Generator (2) (Part by Weight) | Quencher (mmol/1 kg) | Salt (mmol/1 kg) | Organic Solvent (Part by Weight) | Adjudication Substrate 1 Residual | Exposure Sensitivity | Resist Poisoning | Exposure margin | Shape | Substrate 2 Residual/Shape | Substrate 3 Residual/Shape |
|---|---|---|---|---|---|---|---|---|---|---|---|---|---|
| Sample 1 | Polymer A (100) | PAG1 (2) | PAG2 (0.6) | Base 1 (20) | — | PGMEA/EL(60 | × | ◎ | × | △ | ◎ | × | × |
| Sample 2 | Polymer A (100) | PAG1 (2) | PAG2 (0.6) | Base 1 (20) | Salt A (5) | PGMEA/EL(60 | ◎ | ◎ | × | △ | ◎ | ◎ | ◎ |
| Sample 3 | Polymer A (100) | PAG1 (2) | PAG2 (0.6) | Base 1 (20) | Salt A (20) | PGMEA/EL(60 | ◎ | ◎ | ◎ | ◎ | ◎ | ◎ | ◎ |
| Sample 4 | Polymer A (100) | PAG1 (2) | PAG2 (0.6) | Base 1 (20) | Salt A (100) | PGMEA/EL(60 | ◎ | ◎ | ◎ | ◎ | ◎ | ◎ | ◎ |
| Sample 5 | Polymer A (100) | PAG1 (2) | PAG2 (0.6) | Base 1 (20) | Salt A (40) | PGMEA/EL(60 | ◎ | ◎ | ◎ | ◎ | ◎ | ◎ | ◎ |
| Sample 6 | Polymer A (100) | PAG1 (2) | PAG2 (0.6) | Base 1 (20) | Salt A (100) | PGMEA/EL(60 | ◎ | ◎ | ◎ | ◎ | ◎ | ◎ | ◎ |
| Sample 7 | Polymer A (100) | PAG1 (2) | PAG2 (0.6) | Base 1 (20) | Salt A (200) | PGMEA/EL(60 | ◎ | ◎ | ◎ | ◎ | ◎ | ◎ | ◎ |
| Sample 8 | Polymer A (100) | PAG1 (2) | PAG2 (0.6) | Base 1 (20) | Salt A (400) | PGMEA/EL(60 | ◎ | ◎ | ◎ | ◎ | ◎ | ◎ | ◎ |
| Sample 9 | Polymer A (100) | PAG1 (2) | PAG2 (0.6) | Base 1 (20) | Salt A (500) | PGMEA/EL(60 | ○ | ◎ | ◎ | ◎ | △ | ○ | ○ |
| Sample 10 | Polymer A (100) | PAG1 (2) | PAG2 (0.6) | Base 1 (20) | Salt A (10) | PGMEA/EL(60 | ◎ | ◎ | △ | ○ | ◎ | ◎ | ◎ |
| Sample 11 | Polymer A (100) | PAG1 (2) | PAG2 (0.6) | Base 1 (20) | Salt B (5) | PGMEA/EL(60 | ◎ | ◎ | × | △ | ◎ | ◎ | ◎ |
| Sample 12 | Polymer A (100) | PAG1 (2) | PAG2 (0.6) | Base 1 (20) | Salt B (20) | PGMEA/EL(60 | ◎ | ◎ | ◎ | ◎ | ◎ | ◎ | ◎ |
| Sample 13 | Polymer A (100) | PAG1 (2) | PAG2 (0.6) | Base 1 (20) | Salt B (100) | PGMEA/EL(60 | ◎ | ◎ | ◎ | ◎ | ◎ | ◎ | ◎ |
| Sample 14 | Polymer A (100) | PAG1 (2) | PAG2 (0.6) | Base 1 (20) | Salt B (40) | PGMEA/EL(60 | ◎ | ◎ | ◎ | ◎ | ◎ | ◎ | ◎ |
| Sample 15 | Polymer A (100) | PAG1 (2) | PAG2 (0.6) | Base 1 (20) | Salt B (100) | PGMEA/EL(60 | ◎ | ◎ | ◎ | ◎ | ◎ | ◎ | ◎ |
| Sample 16 | Polymer A (100) | PAG1 (2) | PAG2 (0.6) | Base 1 (20) | Salt B (200) | PGMEA/EL(60 | ◎ | ◎ | ◎ | ◎ | ◎ | ◎ | ◎ |
| Sample 17 | Polymer A (100) | PAG1 (2) | PAG2 (0.6) | Base 1 (20) | Salt B (400) | PGMEA/EL(60 | ◎ | ◎ | ◎ | ◎ | ◎ | ◎ | ◎ |
| Sample 18 | Polymer A (100) | PAG1 (2) | PAG2 (0.6) | Base 1 (20) | Salt B (500) | PGMEA/EL(60 | ○ | ◎ | ◎ | ◎ | △ | ○ | ○ |
| Sample 19 | Polymer A (100) | PAG1 (2) | PAG2 (0.6) | Base 1 (20) | Salt A (10) | PGMEA/EL(60 | ◎ | ◎ | △ | ○ | ◎ | ◎ | ◎ |

TABLE 3

| Sample | Base Resin (Part by Weight) | Acid Generator (1) (Part by Weight) | Acid Generator (2) (Part by Weight) | Quencher (mmol/1 kg) | Salt (mmol/1 kg) | Organic Solvent (Part by Weight) | Adjudication Residual | Substrate 1 Exposure Sensitivity | Substrate 1 Resist Poisoning | Substrate 1 Exposure margin | Substrate 1 Shape | Substrate 2 Residual/Shape | Substrate 3 Residual/Shape |
|---|---|---|---|---|---|---|---|---|---|---|---|---|---|
| Sample 20 | Polymer A (100) | PAG1 (5) | PAG2 (0.6) | Base 1 (20) | Salt A (100) | PGMEA/EL(60 | ◎ | ◎ | ◎ | ◎ | ◎ | ◎ | ◎ |
| Sample 21 | Polymer A (100) | PAG3 (5) | PAG2 (0.6) | Base 1 (20) | Salt A (100) | PGMEA/EL(60 | ◎ | ◎ | ◎ | ◎ | ◎ | ◎ | ◎ |
| Sample 22 | Polymer A (100) | PAG3 (2) | PAG2 (0.6) | Base 1 (20) | Salt A (100) | PGMEA/EL(60 | ◎ | ◎ | ◎ | ◎ | ◎ | ◎ | ◎ |
| Sample 23 | Polymer A (100) | PAG4 (3) | | Base 1 (20) | Salt A (100) | PGMEA/EL(60 | ◎ | ◎ | ◎ | ◎ | ◎ | ◎ | ◎ |
| Sample 24 | Polymer A (100) | PAG5 (3) | | Base 1 (20) | Salt A (100) | PGMEA/EL(60 | ◎ | ◎ | ◎ | ◎ | ◎ | ◎ | ◎ |
| Sample 25 | Polymer A (100) | PAG3 (2) | | Base 2 (20) | Salt A (100) | PGMEA/EL(60 | ◎ | ◎ | ◎ | ◎ | ◎ | ◎ | ◎ |
| Sample 26 | Polymer A (100) | PAG4 (2) | PAG4 (0.6) | Base 3 (20) | Salt A (100) | PGMEA/EL(60 | ◎ | ◎ | ◎ | ◎ | ◎ | ◎ | ◎ |
| Sample 27 | Polymer A (100) | PAG1 (2) | PAG5 (0.6) | Base 1 (20) | Salt B (100) | PGMEA/EL(60 | ◎ | ◎ | ◎ | ◎ | ◎ | ◎ | ◎ |
| Sample 28 | Polymer A (100) | PAG1 (2) | PAG2 (0.6) | Base 2 (20) | Salt B (100) | PGMEA/EL(60 | ◎ | ◎ | ◎ | ◎ | ◎ | ◎ | ◎ |
| Sample 29 | Polymer A (100) | PAG1 (2) | PAG2 (0.6) | Base 3 (20) | Salt B (100) | PGMEA/EL(60 | ◎ | ◎ | ◎ | ◎ | ◎ | ◎ | ◎ |
| Sample 30 | Polymer A (100) | PAG1 (2) | PAG2 (0.6) | Base 1 (20) | Salt C (100) | PGMEA/EL(60 | ◎ | ◎ | ◎ | ◎ | ◎ | ◎ | ◎ |
| Sample 31 | Polymer A (100) | PAG1 (2) | PAG2 (0.6) | Base 2 (20) | Salt C (100) | PGMEA/EL(60 | ◎ | ◎ | ◎ | ◎ | ◎ | ◎ | ◎ |
| Sample 32 | Polymer A (100) | PAG1 (2) | PAG2 (0.6) | Base 3 (20) | Salt C (100) | PGMEA/EL(60 | ◎ | ◎ | ◎ | ◎ | ◎ | ◎ | ◎ |
| Sample 33 | Polymer A (100) | PAG1 (2) | PAG2 (0.6) | Base 1 (20) | Salt D (100) | PGMEA/EL(60 | ◎ | ◎ | ◎ | ◎ | ◎ | ◎ | ◎ |
| Sample 34 | Polymer A (100) | PAG1 (2) | PAG2 (0.6) | Base 2 (20) | Salt D (100) | PGMEA/EL(60 | ◎ | ◎ | ◎ | ◎ | ◎ | ◎ | ◎ |
| Sample 35 | Polymer A (100) | PAG1 (2) | PAG2 (0.6) | Base 3 (20) | Salt D (100) | PGMEA/EL(60 | ◎ | ◎ | ◎ | ◎ | ◎ | ◎ | ◎ |

The compositions of the chemically amplified photoresists (samples) used as the photoresist 1 are shown in Tables 2 and 3. Polymer A in the base resin is the very resin expressed by the afore-mentioned Formula (2). The PADs 1 to 5 in the acid generator are the acid generators expressed by the afore-mentioned Formula (5). The unit used for the bases (the quenchers) is [mmol/poly-1000 g] (that is, mmol of the basic compound per 1000 g of the base resin). In the base, "Base 1" is triethanolamine (molecular weight: 149.19), "Base 2" is tri-n-butylamine (molecular weight: 185.36) and "Base 3" is 2-butoxypyridine (molecular weight: 151.21). In the organic solvent, PGMEA indicates propylene glycol monomethyl ether acetate and EL, ethyl lactate.

Further, Salt A is 4-n-dodecylphenylsulfonic acid tris(2-hydroxyethyl)amine; Salt B, 3,5-dimethyl-4-(n-hexyloxy)phenylsulfonic acid-4-(2-acetoxyethyl)morpholine; Salt C, 5-isopropyl-2-methyl-4-(n-decyloxy)phenylsulfonic acid tris(2-isobutyryloxyethyl)amine; Salt D, 4-n-dodecylphenyl-sulfonic acid tris(2-methoxymethoxyethyl)amine and Salt E, 2-methyl-4-(n-dodecyloxy)phenylsulfonic acid tris(2-acetoxyethyl)amine.

The Exposure was made by the KrF excimer laser (wavelength: 248 nm) at 45 mJ/cm2. The ArF excimer laser (wavelength: 193 nm) and the electron beam direct drawing exposure apparatus (50 keV) were also used in the measurements for the systems of the sample 4 with replaced polymers, the results of which were essentially the same as those obtained with the KrF excimer laser.

Two types of laser beams with a wavelength of 248 nm and with a wavelength of 193 nm as well as the electron beam direct drawing exposure were successfully used to generate the acids and makethe exposure. This shows possibilities of the application for the F2 excimer laser and the atomic beam exposure, both of which have even shorter wavelengths.

Further, for the substrates 1-3, qualitative examinations were conducted under the microscope with the eye, and after 100 points were inspected for each substrate, the following marking was made.

1. Residual: The sample was marked with ◎ for none of residual; with ○ for 10% or less; with Δ, for 10 to 15% and with x for 15% or more.

2. Shape: Regarding the L/S shape, the sample was marked with ◎ for none of defective shape; with ○ for 10% or less; with Δ, for 10 to 15% and with x for 15% or more.

3. Exposure sensitivity: The sample was marked with ◎ for 150 mJ/cm2 or less; with ○ for greater than 150 mJ/cm2 but not greater than 200 mJ/cm2; with Δ, for greater than 200 mJ/cm2 but not greater than 300 mJ/cm2 and with x for 300 mJ/cm2 or greater.

It is based on a fact that, with the laser exposure, if the exposure sensitivity is 200 mJ/cm2 or less, compensation can be made through the number of laser pulses, but if the exposure sensitivity exceeds 200 mJ/cm2, compensation can be only made by lowering the scan rate. The reduction of the scan rate lowers the throughput of the apparatus and, thus, the productivity.

4. Exposure margin: The sample was marked with ◎ for ±15% or less; with ○ for ±10% or less; with Δ, for ±7% or less and with x for ±5% or less. The higher the exposure margin is, the higher the process margin becomes so that the manufacturing steps can have some free scope.

5. Resist poisoning: The resist poisoning was inspected through observations of the pattern tailing. The sample was marked with ◎ for none of tailing; with Δ, for tailing at more than one point but not greater than 5% and with x for greater than 5%.

All the substrates 1 to 3 in the present Examples were marked with ◎, while the substrates in the Cases for Comparison were not.

The results of Tables 2 and 3 indicate that as long as the amount of the salt is not less than once but not greater than twenty times the amount of the quencher, no problem of residual, defective shape, exposure sensitivity and resist poisoning arises, regardless of the combination of the acid generator, the quencher and the salt, but when the amount of the salt exceeds twenty times of the amount of the quencher, the residual and/or defective shape may be brought about.

The sample 1 is a conventional chemically amplified resist composition containing only the quencher, which has problems of the residual, the resist poisoning and the exposure margin.

However, it was shown that with an addition of 25% of the salt to the amount of the quencher the residual disappeared.

The base resins employed in these measurements were all the same. No problem arose with the wavelength of the laser or the electron beam exposure used in these measurements.

The results of the change in the number of carbons in the acid part of various salts in the 4-n-alkylphenylsulfonic acid tris(2-hydroxyethyl)amine system are shown in FIG. 4.

In the case of salts in the 4-n-alkylphenylsulfonic acid tris(2-hydroxyethyl)amine system, similar results to that of 4-n-dodecylphenylsulfonic acid tris(2-hydroxyethyl)amine were obtained to up to 4-n-butylphenylsulfonic acid tris(2-hydroxyethyl)amine.

On the other hand, 4-n-propylphenylsulfonic acid tris(2-hydroxyethyl)amine, 4-n-ethylphenylsulfonic acid tris(2-hydroxyethyl)amine or 4-n-methylphenylsulfonic acid tris(2-hydroxyethyl)amine is utilized, the acids cannot buffer the imported base sufficiently, and defective resist patterns are produced.

Under the same conditions as the sample 4, the experiments using 4-n-dodecylphenylsulfonic acid tris(2-hydroxyethyl)amine, 4-n-propylphenylsulfonic acid tris(2-hydroxyethyl)amine, 4-n-ethylphenylsulfonic acid tris(2-hydroxyethyl)amine and 4-n-methylphenylsulfonic acid tris (2-hydroxyethyl)amine as the salts were carried out and their results are shown in FIG. 4.

As seen clearly in FIG. 4, with 4-n-butylphenylsulfonic acid tris(2-hydroxyethyl)amine, no appearance defects arose, but for 4-n-propylphenylsulfonic acid tris(2-hydroxyethyl) amine, 4-n-ethylphenylsulfonic acid tris(2-hydroxyethyl) amine and 4-n-methylphenylsulfonic acid tris(2-hydroxyethyl)amine, the number of appearance defects in the resist patterns increase in this order.

These measurements were made under the same exposure conditions and the combination of the via hole and the L/S pattern with the same dimensions as those for Tables 2 and 3.

Accordingly, the present invention was shown to have effects by the combinations of the acid generator, the quencher and the salt. While all the descriptions in the Examples are made with the chemically amplified positive resist, it will be obvious to those skilled in the art that the invention is applied to the chemically amplified negative resist.

What is claimed is:

1. A chemically amplified resist composition comprising:
a photo acid generator;
an amount of quencher; and
a salt having a buffering function for an acid which is generated from said acid generator by irradiation in an amount that is not less than one time but not greater than ten times the amount of quencher, wherein, said salt having the buffering function for the acid generated from said acid generator is specifically a salt derived from a long chain alkylbenzenesulfonic acid or a long chain alkylbenzenesulfonic acid and an organic amine that is a basic compound, being expressed by the Formula (1):

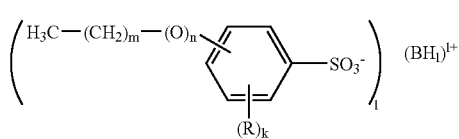

(1)

wherein each R independently represents a hydrogen atom or a straight, branched or cyclic alkyl or alkoxy group containing from 1 to 4 carbons with or without substitution; n is 1; m is an integer of 3 to 23; k is an integer of 0 to 4; l is an integer of 1 to 3; and B is any one of primary, secondary and tertiary aliphatic amines, mixed amines, aromatic amines, heterocyclic amines, nitrogen-containing compounds with a carboxy group, nitrogen-containing compounds with a sulfonyl group, nitrogen-containing compounds with a hydoxy group, nitrogen-containing compounds with a hydroxyphenyl group, alcoholic nitrogen-containing compounds, nitrogen-containing compounds with a cyano group, amide derivatives, imide derivatives and nitrogen-containing compounds comprising one or more oxygen atom.

2. A chemically amplified resist composition according to claim 1, wherein said acid generator comprises at least one compound which is selected from the group consisting of onium salts, diazomethane derivatives, glyoxime derivatives, β-ketosulfone derivatives, disulfone derivatives, nitrobenzenesulfonate derivatives, sulfone acid ester derivatives and imidosulfonate derivatives.

3. A chemically amplified resist Composition according to claim 2, wherein said acid generator generates an acid by irradiation of an electron beam with a wavelength of 365 nm-0.1 nm and an energy of 300 keV-1 keV.

4. A chemically amplified resist composition according to claim 1, wherein said quencher comprises at least one compound selected from the group consisting of triethanolamine, tri-n-butylamine, 2-butoxypyridine, primary, secondary and tertiary aliphatic amines, mixed amines, aromatic amines, heterocyclic amines, nitrogen-containing compounds with a carboxy group, nitrogen-containing compounds with a sulfonyl group, nitrogen-containing compounds with a hydoxy group, nitrogen-containing compounds with a hydroxyphenyl group, alcoholic nitrogen-containing compounds, amide derivatives, imide derivatives and nitrogen-containing compound having one or more oxygen atoms.

5. A chemically amplified resist composition according to claim 1, wherein R is a straight, branched, or cyclic alkyl or alkoxy group containing from 1 to 4 carbons with or without substitution.

6. A chemically amplified resist composition comprising:
a photo acid generator;
a quencher; and
a salt having a buffering function for an acid which is generated from said acid generator by irradiation, wherein,
said salt having the buffering function for the acid generated from said acid generator is specifically a salt derived from a long chain alkylbenzenesulfonic acid or a long chain alkoxybenzenesulfonic acid and an organic amine that is a basic compound, being expressed by the Formula (1a):

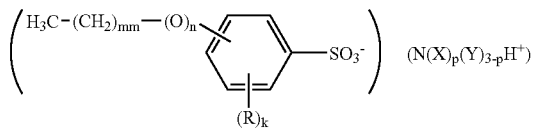

(1a)

wherein each R independently represents a hydrogen atom or a straight, branched or cyclic alkyl or alkoxy group containing from 1 to 4 carbons with or without substitution; n is 0 or 1; k is an integer of 0 to 4; mm is an integer of 3 to 11; p is an integer of 1 to 3; side chains Y each independently represent a hydrogen atom or a straight, branched or cyclic alkyl group containing from 1 to 20 carbons, which may comprise an ether bond or a hydroxyl group; chains X can be identical or different and each expressed by one of the Formulae (X)-1 to (X)-3; and may combine with each other to form a ring:

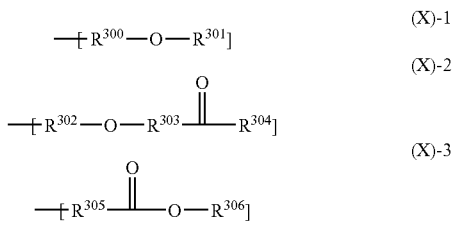

$R^{300}$, $R^{302}$ and $R^{305}$ are each a straight or branched alkylene group containing from 1 to 4 carbons; $R^{301}$ and $R^{304}$ are each a hydrogen atom or a straight, branched or cyclic alkyl group containing from 1 to 20 carbons, which may comprise one or more hydroxy groups, ether bonds, ester bonds and/or lactone rings; $R^{303}$ is a straight or branched single bond alkylene group containing from 1 to 4 carbons; and $R^{306}$ is a straight, branched or cyclic alkyl group containing from 1 to 20 carbons, which may comprise one or more hydroxy groups, ether bonds, ester bonds and/or lactone rings.

7. A chemically amplified resist composition according to claim 6, wherein R each independently represent a hydrogen atom or a straight, branched or cyclic alkyl or alkoxy group containing from 1 to 4 carbons with or without substitution; n is 0 or 1; k is an integer of 0 to 2; mm is an integer of 5 to 11; p is an integer of 1 to 3; side chains Y each independently represent a hydrogen atom or a straight, branched or cyclic alkyl group containing from 1 to 12 carbons, which may comprise an ether bond or a hydroxyl group; side chains X can be each, independently with one another, expressed by one of the Formulae (X)-1 to (X)-3; Xs may combine with each other to form a ring; $R^{300}$, $R^{302}$ and $R^{305}$ are each a straight or branched alkylene group containing from 1 to 4 carbons; $R^{301}$ and $R^{304}$ are each a hydrogen atom or a straight, branched or cyclic alkyl group containing from 1 to 12 carbons, which may comprise one or more hydroxy groups, ether bonds, ester bonds and/or lactone rings; $R^{303}$ is a straight or branched single-bond alkylene group containing from 1 to 4 carbons; and $R^{306}$ is a straight, branched or cyclic alkyl group containing from 1 to 12 carbons, which may comprise one or more hydroxy groups, ether bonds, ester bonds and/or lactone rings.

8. A chemically amplified resist composition according to claim 6, wherein, R each independently represents a hydrogen atom or a straight, branched or cyclic alkyl or alkoxy group containing from 1 to 4 carbons with or without substitution; n is 0 or 1; k is an integer of 0 to 2; mm is an integer of 5 to 11; p is an integer of 1 to 3; and side chains X can be identical or different, each expressed by one of the Formulae (X)-1 to (X)-3:

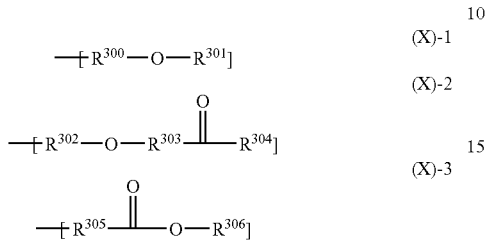

9. A chemically amplified resist composition according to claim 6, wherein said acid generator comprises at least one compound which is selected from the group consisting of onium salts, diazomethane derivatives, glyoxime derivatives, β-ketosulfone derivatives, disulfone derivatives, nitrobenzenesulfonate derivatives, sulfone acid ester derivatives and imidosulfonate derivatives.

10. A chemically amplified resist composition according to claim 9, wherein said acid generator generates an acid by irradiation of an electron beam with a wavelength of 365 nm-0.1 nm or an energy of 300 keV-1 keV.

11. A chemically amplified resist composition according to claim 6, wherein said quencher comprises at least one compound selected from the group consisting of triethanolamine, tri-n-butylamine, 2-butoxypyridine, primary, secondary and tertiary aliphatic amines, mixed amines, aromatic amines, heterocyclic amines, nitrogen-containing compounds with a carboxy group, nitrogen containing compounds with a sulfonyl group, nitrogen-containing compounds with a hydoxy group, nitrogen-containing compounds with a hydroxyphenyl group, alcoholic nitrogen-containing compounds, amide derivatives, imide derivatives and nitrogen-containing compound having one or more oxygen atoms.

12. A chemically amplified resist composition comprising:
at least a photo acid generator;
a quencher; and
a salt having a buffering function for an acid which is generated from said acid generator by irradiation, wherein,
said salt having the buffering function for the acid generated from said acid generator is specifically a salt derived from a long chain alkylbenzenesulfonic acid or a long chain alkoxybenzenesulfonic acid and an organic amine that is a basic compound, being expressed by the Formula (1b):

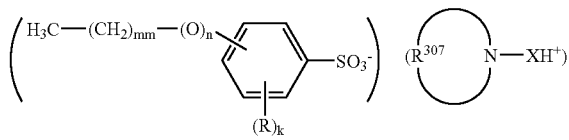

wherein each R independently represents a hydrogen atom or a straight, branched or cyclic alkyl or alkoxy group containing from 1 to 4 carbons with or without substitution; n is 0 or 1; k is an integer of 0 to 4; mm is an integer of 3 to 11; $R^{307}$ is a straight or branched alkylene group containing from 2 to 20 carbons, which may comprise one or more carbonyl bonds, ether bonds, ester bonds, sulfide bonds, sulfinyl bonds and/or sulfonyl bonds; and X is expressed by one of the Formulae (X)-1 to (X)-3:

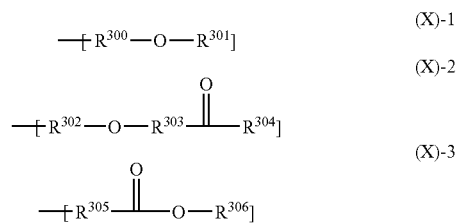

13. A chemically amplified resist composition according to claim 12, wherein, R each independently represents a hydrogen atom or a straight, branched or cyclic alkyl oralkoxy group containing from 1 to 4 carbons with or without substitution; n is 0 or 1; k is an integer of 0 to 2; a side chain X can be expressed by one of the Formulae (X)-1 to (X)-3; mm is an integer of 5 to 11; and $R^{307}$ is a straight or branched alkylene group containing from 2 to 8 carbons, which may comprise one or more carbonyl bonds, ether bonds, ester bonds and/or sulfide bonds.

14. A chemically amplified resist composition according to claim 12, wherein R each independently represents a hydrogen atom or a straight, branched or cyclic alkyl or alkoxy group containing from 1 to 4 carbons with or without substitution; n is 0 or 1; k is an integer of 0 to 2; side chains X can each be independently expressed by one of the Formulae (X)-1 to (X)-3; mm is an integer of 5 to 11; $R^{307}$ is a straight or branched alkylene group containing from 2 to 6 carbons, which may comprise one or more carbonyl bonds and/or ether bonds.

15. A chemically amplified resist composition according to claim 12, wherein said acid generator comprises at least one compound which is selected from the group consisting of onium salts, diazomethane derivatives, glyoxime derivatives, β-ketosulfone derivatives, disulfone derivatives, nitrobenzenesulfonate derivatives, sulfone acid ester derivatives and imidosulfonate derivatives.

16. A chemically amplified resist composition according to claim 15, wherein said acid generator generates an acid by irradiation of an electron beam with a wavelength of 365 nm-0.1 nm or an energy of 300 keV-1 keV.

17. A chemically amplified resist composition according to claim 12, wherein said quencher comprises at least one compound selected from the group consisting of triethanolamine, tri-n-butylamine, 2-butoxypyridine, primary, secondary and tertiary aliphatic amines, mixed amines, aromatic amines, heterocyclic amines, nitrogen-containing compounds with a carboxy group, nitrogen-containing compounds with a sulfonyl group, nitrogen-containing compounds with a hydoxy group, nitrogen-containing compounds with a hydroxyphenyl group, alcoholic nitrogen-containing compounds, amide derivatives, imide derivatives and nitrogen-containing compound having one or more oxygen atoms.

18. A chemically amplified resist composition comprising at least a photo acid generator, a quencher and a salt having a buffering function for an acid which is generated from said acid generator by irradiation; wherein:

said salt having a buffering function for an acid which is generated from said acid generator comprises at least one salt selected from the group consisting of 4-n-dodecylphenylsulfonic acid tris(2-hydroxyethyl)amine, 3,5-dimethyl-4-(n-hexyloxy)phenylsulfonicacid-4-(2-acetoxyethyl) morpholine, 5-isopropyl-2-methyl-4-(n-decyloxy)phenylsulfonic acid tris(2-isobutyryloxyethyl)amine, 4-n-dodecylphenylsulfonic acid tris(2-methoxymethoxyethyl)amine and 2-methyl-4-(n-dodecyloxy)phenylsulfonic acid tris(2-acetoxyethyl)amine.

19. A chemically amplified resist composition according to claim 18, wherein said acid generator comprises at least one compound which is selected from the group consisting of onium salts, diazomethane derivatives, glyoxime derivatives, β-ketosulfone derivatives, disulfone derivatives, nitrobenzenesulfonate derivatives, sulfone acid ester derivatives and imidosulfonate derivatives.

20. A chemically amplified resist composition according to claim 19, wherein said acid generator generates an acid by irradiation of an electron beam with a wavelength of 365 nm-0.1 nm or an energy of 300 keV-1 keV.

21. A chemically amplified resist composition according to claim 18, wherein said quencher comprises at least one compound selected from the group consisting of triethanolamine, tri-n-butylamine, 2-butoxypyridine, primary, secondary and tertiary aliphatic amines, mixed amines, aromatic amines, heterocyclic amines, nitrogen-containing compounds with a carboxy group, nitrogen-containing compounds with a sulfonyl group, nitrogen-containing compounds with a hydoxy group, nitrogen-containing compounds with a hydroxyphenyl group, alcoholic nitrogen-containing compounds, amide derivatives, imide derivatives and nitrogen-containing compound having one or more oxygen atoms.

22. A chemically amplified resist composition comprising:
a photo acid generator;
a quencher; and
a buffering salt for an acid generated from said photo generator by irradiation, said buffering salt of the Formula (1):

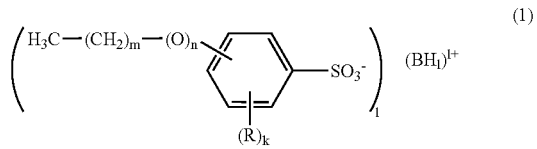

(1)

wherein, m is an integer of 3 to 23; n is 1; k is an integer of 0 to 4; each R independently represents a hydrogen atom or a straight, branched or cyclic alkyl or alkoxy group containing from 1 to 4 carbons with or without substitution; I is an integer of 1 to 3; and B is any one of primary, secondary and tertiary aliphatic amines, mixed amines, aromatic amines, heterocyclic amines, nitrogen-containing compounds with a carboxy group, nitrogen-containing compounds with a sulfonyl group, nitrogen-containing compounds with a hydoxy group, nitrogen-containing compounds with a hydroxyphenyl group, alcoholic nitrogen-containing compounds, nitrogen-containing compounds with a cyano group, amide derivatives, imide derivatives and nitrogen-containing compounds comprising one or more oxygen atom.

23. A chemically amplified resist composition comprising:
a photo acid generator;
a quencher; and
a buffering salt for an acid generated from said acid generator by irradiation and of the Formula 1(a):

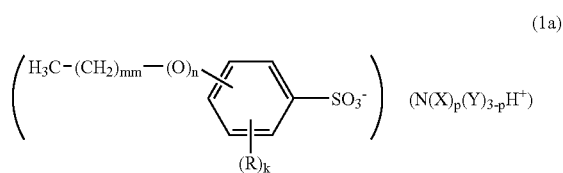

(1a)

wherein, mm is an integer of 3 to 11; n is 0 or 1; k is an integer of 0 to 4; p is an integer of 1 to 3; R each independently represent a hydrogen atom or a straight, branched or cyclic alkyl or alkoxy group containing from 1 to 4 carbons with or without substitution; Y each independently represent a hydrogen atom or a straight, branched or cyclic alkyl group containing from 1 to 20 carbons, which may comprise an ether bond or a hydroxyl group; X each independently represent one of Formulae (X)-1 to (X)-3:

  (X)-1

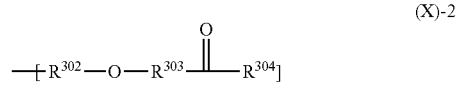  (X)-2

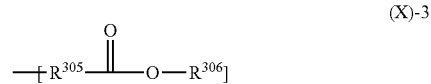  (X)-3 wherein, Xs may combine with each other to form a ring; $R^{300}$, $R^{302}$ and $R^{305}$ are each a straight or branched alkylene group containing from 1 to 4 carbons; $R^{301}$ and $R^{304}$ are each a hydrogen atom or a straight, branched or cyclic alkyl group containing from 1 to 20 carbons, which may comprise one or more hydroxy groups, ether bonds, ester bonds and/or lactone rings; $R^{303}$ is a straight or branched single bond alkylene group containing from 1 to 4 carbons; and $R^{306}$ is a straight, branched or cyclic alkyl group containing from 1 to 20 carbons, which may comprise one or more hydroxy groups, ether bonds, ester bonds and/or lactone rings.

* * * * *